United States Patent
Ogawa et al.

(10) Patent No.: US 9,905,311 B2
(45) Date of Patent: Feb. 27, 2018

(54) SHIFT REGISTER CIRCUIT, DRIVE CIRCUIT, AND DISPLAY DEVICE

(71) Applicant: Sharp Kabushiki Kaisha, Osaka (JP)

(72) Inventors: Yasuyuki Ogawa, Osaka (JP); Kaoru Yamamoto, Osaka (JP); Akihiro Oda, Osaka (JP); Masahiro Tomida, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 94 days.

(21) Appl. No.: 14/774,558

(22) PCT Filed: Feb. 12, 2014

(86) PCT No.: PCT/JP2014/053228
§ 371 (c)(1),
(2) Date: Sep. 10, 2015

(87) PCT Pub. No.: WO2014/141800
PCT Pub. Date: Sep. 18, 2014

(65) Prior Publication Data
US 2016/0042806 A1    Feb. 11, 2016

(30) Foreign Application Priority Data

Mar. 12, 2013    (JP) .................. 2013-049623

(51) Int. Cl.
*G06F 3/038*      (2013.01)
*G11C 19/28*      (2006.01)
*G09G 3/36*       (2006.01)

(52) U.S. Cl.
CPC .......... *G11C 19/28* (2013.01); *G09G 3/3648* (2013.01); *G09G 3/3677* (2013.01);
(Continued)

(58) Field of Classification Search
CPC .... G11C 19/28; G09G 3/3648; G09G 3/3677; G09G 2300/0408; G09G 2300/0426;
(Continued)

(56) References Cited

U.S. PATENT DOCUMENTS

| 6,304,110 B1 | 10/2001 | Hirano | |
|---|---|---|---|
| 2007/0222074 A1* | 9/2007 | Bakkers | ................ B82Y 10/00 257/750 |

(Continued)

FOREIGN PATENT DOCUMENTS

| JP | 11-355123 A | 12/1999 |
|---|---|---|
| JP | 2006-174294 A | 6/2006 |

(Continued)

*Primary Examiner* — Mark Regn
(74) *Attorney, Agent, or Firm* — Chen Yoshimura LLP

(57) ABSTRACT

A shift register circuit has a plurality of unit circuits that are cascade-connected to one another and that output received pulse signals as output signals in accordance with a clock signal, the shift register circuit sequentially outputting the output signals from the plurality of respective unit circuits. The output circuits each include a double-gate transistor having first gate electrode that controls conductivity between the drain electrode and the source electrode, and a second gate electrode formed through an insulating layer and disposed to face the first gate electrode across a semiconductor layer between the drain electrode and the source electrode. The shift register circuit applies a prescribed voltage to the second gate electrode in accordance with a voltage applied to the first gate electrode.

5 Claims, 16 Drawing Sheets

(52) U.S. Cl.
CPC .......... *G09G 2300/0408* (2013.01); *G09G 2300/0426* (2013.01); *G09G 2310/0286* (2013.01); *G09G 2310/08* (2013.01); *G09G 2320/043* (2013.01)

(58) Field of Classification Search
CPC ....... G09G 2310/0286; G09G 2310/08; G09G 2320/043
USPC .......................................................... 345/205
See application file for complete search history.

(56) References Cited

U.S. PATENT DOCUMENTS

| | | | | |
|---|---|---|---|---|
| 2009/0251443 | A1* | 10/2009 | Jinta | G09G 3/3233 345/204 |
| 2011/0102409 | A1 | 5/2011 | Hayakawa | |
| 2011/0150169 | A1* | 6/2011 | Lin | G11C 19/28 377/64 |
| 2012/0074985 | A1* | 3/2012 | Kimura | H03K 3/356121 326/103 |
| 2012/0306829 | A1* | 12/2012 | Furuta | G09G 3/3677 345/204 |

FOREIGN PATENT DOCUMENTS

| | | | |
|---|---|---|---|
| JP | 2009-94927 A | | 4/2009 |
| JP | 2009094927 A | * | 4/2009 |
| JP | 2011-120221 A | | 6/2011 |

* cited by examiner

SHIFT REGISTER CIRCUIT, DRIVE CIRCUIT, AND DISPLAY DEVICE

TECHNICAL FIELD

The present invention relates to a shift register circuit, a drive circuit, and a display device.

This application claims the benefit of Japanese Patent Application No. 2013-049623, filed in Japan on Mar. 12, 2013, which is hereby incorporated by reference in its entirety.

BACKGROUND ART

Monolithic circuit technology has recently been proliferating in the field of active matrix display devices. This technology involves forming, on the same glass substrate, pixel TFTs (thin film transistors) for controlling the application of electric charge to the pixels, and peripheral circuit TFTs that form a portion of a driver circuit or the like.

The abovementioned TFTs, however, have fluctuations in the threshold voltage for switching operation of the TFTs due to voltage stress applied to the gate electrodes, and this is known to cause characteristic degradation of the TFTs. Patent Document 1, for example, discloses a double-gate structure TFT having back gates, and when such characteristic degradation occurs, the drive circuit applies a control voltage of the same polarity as the fluctuation in threshold voltage to the back gates, thereby compensating for the fluctuation in threshold voltage.

RELATED ART DOCUMENT

Patent Document

Patent Document 1: Japanese Patent Application Laid-Open Publication No. 2006-174294

SUMMARY OF THE INVENTION

Problems to be Solved by the Invention

In the technology in Patent Document 1, however, the fluctuation in threshold voltage is indeed compensated for, yet it may become necessary, when the fluctuation in threshold voltage is large, to apply a high voltage of several dozen volts to the back gates, for example. Furthermore, in the technology in Patent Document 1, it is necessary to provide a threshold adjusting circuit for generating the control voltage applied to the back gates, for example. Thus, in the abovementioned display device, it would be desirable not to compensate for fluctuation in threshold voltage, but rather to reduce the characteristic degradation itself that is leading to these fluctuations in threshold voltage.

The present invention was made in view of the above-mentioned problems, and aims at providing a shift register circuit, drive circuit, and display device that can reduce characteristic degradation.

Means for Solving the Problems

In order to solve the above-mentioned problems, in one aspect of the present invention, a shift register circuit includes: a plurality of unit circuits that are cascade-connected to one another and that each sequentially output a received pulse signal as an output signal in accordance with a clock signal, wherein the unit circuits each include a transistor having a double-gate structure including a drain electrode, a source electrode, a first gate electrode that controls conductivity between the drain electrode and the source electrode, and a second gate electrode formed through an insulating layer and disposed to face the first gate electrode across a semiconductor layer between the drain electrode and the source electrode, and wherein, in each of the unit circuits, a prescribed voltage is applied to the second gate electrode in accordance with a voltage applied to the first gate electrode.

In the above-mentioned shift register circuit according to another aspect of the present invention, the respective unit circuits, when applying a voltage representing a high logic state to the first gate electrode, apply a voltage representing a low logic state to the second gate electrode.

In the above-mentioned shift register circuit according to another aspect of the present invention, the respective unit circuits, when applying a voltage representing a low logic state to the first gate electrode, apply a voltage representing a high logic state to the second gate electrode.

In the above-mentioned shift register circuit according to another aspect of the present invention, the respective unit circuits, in only a part of a period when the voltage representing the low logic state is applied to the first gate electrode, apply the voltage representing the high logic state to the second gate electrode.

In the above-mentioned shift register circuit according to another aspect of the present invention, the transistor having the double-gate structure is an output transistor connected to an output terminal outputting the output signal.

In the above-mentioned shift register circuit according to another aspect of the present invention, the second gate electrode of the output transistor is connected to an internal node in the same unit circuit such that a voltage representing a logic state that is an inverse of a logic state of a voltage applied to the first gate electrode is applied to the second gate electrode.

In the above-mentioned shift register circuit according to another aspect of the present invention, the second gate electrode of the output transistor is connected to the output terminal of a different one of the unit circuits.

In the above-mentioned shift register circuit according to another aspect of the present invention, the second gate electrode of the output transistor is connected to a second clock signal having a differing phase from the clock signal.

In the above-mentioned shift register circuit according to another aspect of the present invention, each of the unit circuits further includes a control transistor that controls conductivity between a prescribed node and a power supply line that receives a power-supply voltage, and the control transistor is the transistor having the double-gate structure.

In the above-mentioned shift register circuit according to another aspect of the present invention, the prescribed node includes the output terminal that outputs the output signal.

In the above-mentioned shift register circuit according to another aspect of the present invention, the prescribed node includes a node connected to the gate electrode of an output transistor that is connected to an output terminal for outputting the output signal.

In the above-mentioned shift register circuit according to another aspect of the present invention, the second gate electrode of the control transistor is connected to a signal line that receives an initialization signal for initializing an internal state of the corresponding unit circuit.

In the above-mentioned shift register circuit according to another aspect of the present invention, the transistor having the double-gate structure is formed by an oxide semiconductor.

In the above-mentioned shift register circuit according to another aspect of the present invention, the second gate electrode is formed as a transparent electrode.

In the above-mentioned shift register circuit according to another aspect of the present invention, the second gate electrode is formed as an opposite electrode of a liquid crystal display panel via the insulating film and a liquid crystal layer in which liquid crystal is sealed.

In the above-mentioned shift register circuit according to another aspect of the present invention, the transistor having the double-gate structure, in a part of a pullback period, applies a voltage that is at least a voltage representing a high logic state to the second gate electrode.

In the above-mentioned shift register circuit according to another aspect of the present invention, the transistor having the double-gate structure is a part of a transistor forming the corresponding unit circuit.

Another aspect of the present invention provides a drive circuit, including the above-mentioned shift register circuit.

Another aspect of the present invention provides a display device, including the abovementioned drive circuit.

Effects of the Invention

Several aspects of the present invention can reduce characteristic degradation.

DETAILED DESCRIPTION OF EMBODIMENTS

A shift register circuit, drive circuit, and display device according to one aspect of the present invention will be explained below with reference to the drawings.

Embodiment 1

First, the configuration of a display device 100 of the present embodiment will be described.

Figure 1:
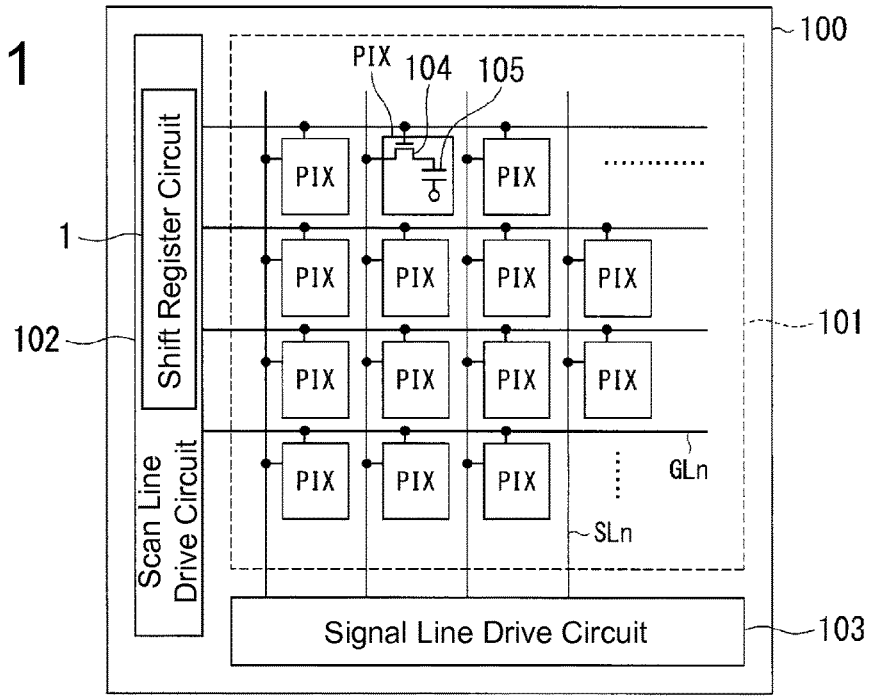
FIG. 1 is schematic block view of one example of a display device common to a plurality of embodiments of the present invention.

FIG. 1 is a schematic block view of one example of the display device 100 common to a plurality of embodiments of the present invention.

In FIG. 1, the display device 100 is an active matrix liquid crystal display device, for example, and includes a display unit 101, scan line drive circuit 102, and signal line drive circuit 103.

The display unit 101 includes a plurality of signal lines (SL1 to SLn, etc.), a plurality of scan lines (GL1 to GLn, etc.), and a plurality of pixel units PIX.

The pixel units PIX are arranged in a matrix at the respective intersections of the plurality of signal lines (SL1 to SLn, etc.) and plurality of scan lines (GL1 to GLn, etc.), and form a display region of the display device 100. The plurality of pixel units PIX include a liquid crystal material inserted between two substrates, a pixel TFT (thin film transistor) 104 disposed on the substrate, and a pixel capacitor 105 formed by the liquid crystal material.

The pixel TFTs 104 each have a gate terminal connected to one of the scan lines (GLn) going through the corresponding intersection; a source terminal connected to one of the signal lines (SLn); and a drain terminal connected to a first terminal of the pixel capacitor 105.

It should be noted that, in the present embodiment, the pixel TFTs 104 are n-channel field effect transistors (hereinafter, "n-type transistors"), and the semiconductor layer thereof can be made of an oxide semiconductor such as In—Ga—Zn—O (indium gallium zinc oxide) or the like, for example.

The pixel capacitors 105 hold a voltage corresponding to respective pixel values, which are based on data signals for displaying images on the display device 100.

The scan line drive circuit 102 includes a shift register circuit 1 and generates scan signals (gate signals G1 to Gn, etc.; described later) for selecting the respective scan lines (GL1 to GLn, etc.). The scan line drive circuit 102 outputs scan signals each having prescribed differences in timing to the respective scan lines GLn by the shift register circuit 1 sequentially staggering the start pulses (start pulse signals SP; described later) in synchronization with clock signals (CK1 and CK2), which will be described later. The shift register circuit 1 will be described in detail later.

It should be noted that, in the present embodiment, the scan line drive circuit 102 is constituted by the pixel TFTs 104 described above and the peripheral circuit TFTs, which are formed on the same glass substrate as the pixel TFTs 104. In this example, in a similar manner to the pixel TFTs 104, the peripheral circuit TFTs are n-type transistors, and the semiconductor layer thereof can be made of an oxide semiconductor such as In—Ga—Zn—O or the like, for example.

The signal line drive circuit 103 generates data signals that supply voltages corresponding to pixel values to the respective pixel units PIX. The signal line drive circuit 103 outputs the generated data signals to the pixels in synchronization with the selection of the scan lines (GL1 to GLn, etc.).

Next, the configuration of the shift register circuit 1 of Embodiment 1 will be described with reference to FIG. 2.

Figure 2:
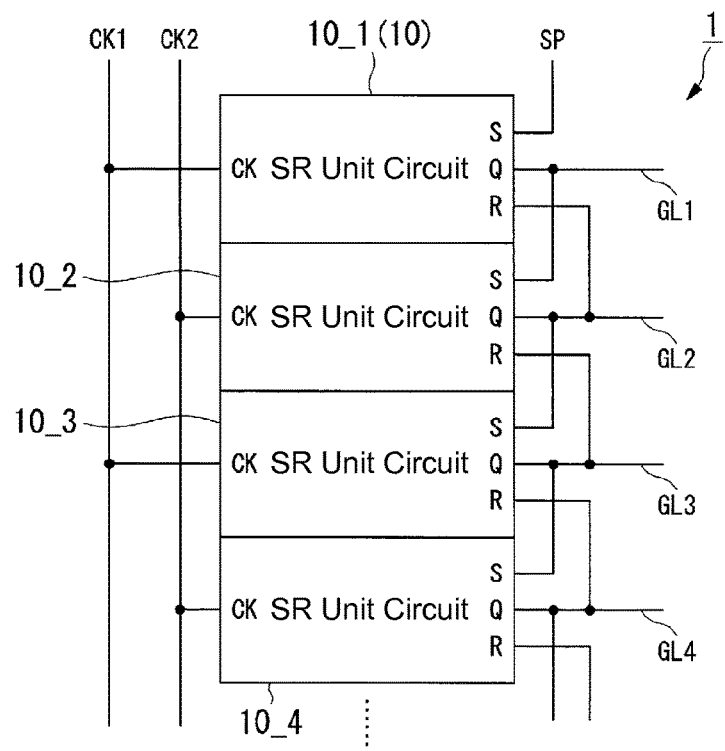
FIG. 2 is a schematic block view of one example of a shift register circuit according to Embodiment 1.

FIG. 2 is a schematic block view of one example of the shift register circuit 1 (FIG. 1) according to Embodiment 1.

In FIG. 2, the shift register circuit 1 includes a plurality of SR unit circuits 10 (10_1, 10_2, 10_3, 10_4, etc.). The shift register circuit 1 has the plurality of SR unit circuits 10 connected in a cascade arrangement, and when the start pulse signals SP are received, the shift register circuit sequentially outputs the gate signals G1 to Gn to the scan lines (GL1 to GLn, etc.) from the plurality of SR unit circuits 10 in accordance with the clock signals (CK1 and CK2).

In this example, the SR unit circuit 10_1, SR unit circuit 10_2, SR unit circuit 10_3, SR unit circuit 10_4, etc., each have the same configuration; thus, when not distinguishing among any particular SR unit circuit or the like, or when simply indicating the SR unit circuits of the shift register circuit 1, these SR unit circuits may be described as the SR unit circuit 10.

It should be noted that, in the example shown in FIG. 2, the signal line for the clock signal CK1 is connected to the clock signal CK input terminals of the odd-numbered SR unit circuits 10 (SR unit circuit 10_1, SR unit circuit 10_3). Furthermore, the signal line for the clock signal CK2 is connected to the clock signal CK input terminals of the even-numbered SR unit circuits 10 (SR unit circuit 10_2, SR unit circuit 10_4). In this example, the clock signal CK1 and clock signal CK2 have mutually differing phases.

In regards to the SR unit circuit 10_1, the input terminal for the input pulse signal S (input signal) is connected to the signal line for the start pulse signal SP, and the input terminal of a reset signal R is connected to the signal line (scan line GL2) for an output signal Q of the next SR unit circuit 10_2. Furthermore, in the SR unit circuit 10_1, the output terminal of the output signal Q connects to the scan line GL1 and is connected to the input terminal of the input pulse signal S of the next SR unit circuit 10_2.

In regards to the SR unit circuit 10_2, the input terminal of the input pulse signal S is connected to the signal line (scan line GL1) of the output signal Q of the previous SR unit circuit 10_1, and the input terminal of the reset signal R is connected to the signal line (scan line GL3) of the output signal Q of the next SR unit circuit 10_3. Furthermore, in the SR unit circuit 10_2, the output terminal of the output signal Q connects to the scan line GL2 and is connected to the input terminal of the input pulse signal S of the next SR unit circuit 10_3 and the input terminal of the reset signal R of the previous SR unit circuit 10_1.

In a similar manner to the SR unit circuit 10_2, in regards to the SR unit circuit 10_3 and the SR unit circuit 10_4, the input terminal of the input pulse signal S is connected to the signal line of the output signal Q of the previous SR unit circuit 10, and the input terminal of the reset signal R is connected to the signal line of the output signal Q of the next SR unit circuit 10.

In this manner, the shift register circuit 1 has a plurality of the SR unit circuits 10 connected in a cascade arrangement, and sequentially outputs output signals to the scan lines GL1 to GL4, etc., from the respective SR unit circuits 10.

Next, the configuration of the SR unit circuits 10 of the present embodiment will be described with reference to FIG. 3.

Figure 3:
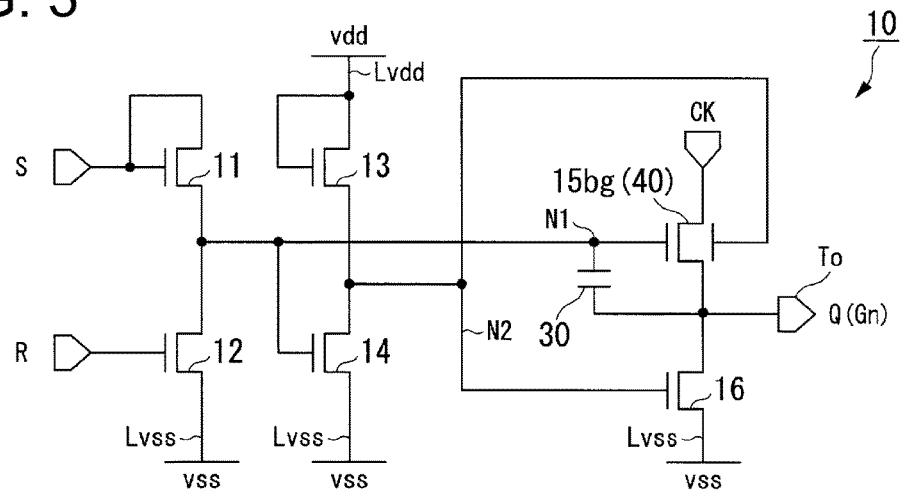
FIG. 3 is a schematic block view of one example of a SR unit circuit according to Embodiment 1.

FIG. 3 is a schematic block view of one example of the SR unit circuits 10 according to Embodiment 1.

In FIG. 3, the SR unit circuits 10 include TFTs (11 to 14, 15*bg*, 16) and a capacitor 30. In this example, the TFTs (11 to 14, 15*bg*, 16) are the peripheral circuit TFTs described above, and are n-channel thin film transistors having an oxide semiconductor such as In—Ga—Zn—O, for example.

The TFT 11 has the drain terminal and the gate terminal thereof connected to the signal line of the input pulse signal S (input signal) and the source terminal connected to a node N1. The TFT 11 functions as a diode, and when the logic state of the input pulse signal S is high (hereinafter, also referred to as "H state"), the TFT supplies to the node N1 a voltage that has been lowered in an amount equal to the threshold voltage of the TFT 11 from the voltage representing the H state supplied to the signal line of the input pulse signal S.

The TFT 12 has the drain terminal thereof connected to the node N1, the gate terminal connected to the signal line of the reset signal R, and the source terminal connected to a power supply line Lvss that supplies a power-supply voltage vss. In this example, the power-supply voltage vss is supplied as a reference potential for operation of the SR unit circuit 10. The TFT 12 becomes conductive when the reset signal R is in the H state, and the TFT then sets the node N1 to the low state (hereinafter, also referred to as the "L state"). In this example, the low state is a logic state in which the voltage is lower than in the high state, and indicates that the voltage is the power-supply voltage vss. Furthermore, the TFT 12 becomes non-conductive when the reset signal R is in the L state.

The TFT 13 has the drain terminal and the gate terminal thereof connected to a power supply line Lvdd of a power-supply voltage vdd, and the source terminal connected to a node N2. In this example, the TFT 13 functions as a diode, and supplies to the node N2 a voltage that has been lowered in an amount equal to the threshold voltage of the TFT 13 from the power-supply voltage vdd supplied to the power supply line Lvdd. It should be noted that the power-supply voltage vdd (first power supply potential) is higher (has a higher potential) than the power-supply voltage vss (second power supply potential).

The TFT 14 has the drain terminal thereof connected to the node N2, the gate terminal connected to the node N1, and the source terminal connected to the power supply line Lvss. The TFT 14 becomes conductive when the node N1 is in the H state, and sets the node N2 to the L state. Furthermore, the TFT 14 becomes non-conductive when the node N1 is in the L state, and sets the node N2 to the H state through voltage supplied from the power supply line Lvdd via the TFT 13.

The TFT 15*bg* is an output transistor that is connected to an output terminal To for outputting output signals of the SR unit circuit 10 and that outputs pulse signals as the output signals Q (Gn). Specifically, the TFT 15*bg* has the drain terminal thereof connected to the signal line of the clock signal CK, the gate terminal connected to the node N1, and the source terminal connected to the output terminal To.

Figure 4:
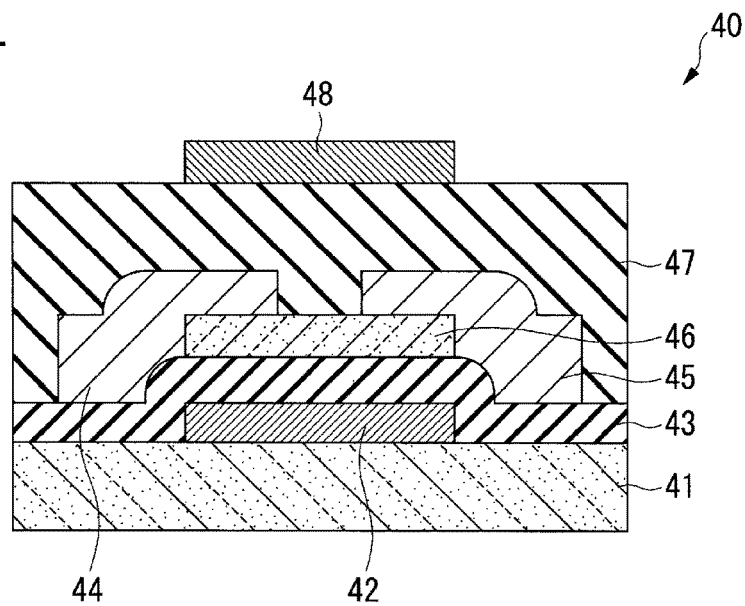
FIG. 4 is a cross-sectional view of one example of a double-gate TFT of Embodiment 1.

Furthermore, the TFT 15*bg* is constituted by a double-gate TFT 40 (see FIG. 4), which will be described later. In other words, as shown in FIG. 4, the TFT 15*bg* includes a gate electrode 42 (first gate electrode) as a gate terminal for controlling the conductivity between a drain electrode 45 (drain terminal) and source electrode 44 (source terminal), and a back-gate electrode 48 (second gate electrode) for suppressing or recovering from fluctuations (shifts) in the threshold voltage Vth. The TFT 15*bg* has the gate electrode 42 connected to the node N1, and the back-gate electrode 48 connected to the node N2.

Returning to FIG. 3, the TFT 16 has the drain terminal thereof connected to the output terminal To, the gate terminal connected to the node N2, and the source terminal connected to the power supply line Lvss. In this example, the TFT 16 is a control transistor that controls conductivity between the output terminal To and the power supply line Lvss through which the power-supply voltage vss is supplied. The TFT 16 becomes conductive when the node N2 is in the H state, and sets the output terminal To to the L state. Furthermore, the TFT 16 becomes non-conductive when the node N2 is in the L state. It should be noted that when this TFT 16 is non-conductive and the gate terminal of the TFT 15*bg* is in the H state, the TFT 15*bg* outputs a pulse signal to the output terminal To of the output signal Q via the clock signal CK.

The capacitor 30 is a bootstrap capacitor that connects to between the node N1 and the output terminal To. The capacitor 30 transmits the amount of variation in voltage of the output terminal To to the node N1, and sets the node N1 to a voltage that is higher than the "voltage representing the H state of the clock signal CK+ the threshold voltage of the TFT 15*bg*." This operation is called a bootstrap operation, and the TFT 15*bg* transmits the H level of the clock signal CK to the output terminal To with no voltage loss through this bootstrap operation.

Next, the configuration of the double-gate TFT 40 (transistor having the double-gate structure) constituting the above-mentioned TFT 15*bg* will be explained with reference to FIG. 4.

FIG. 4 is a cross-sectional view of one example of the double-gate TFT 40 of the present embodiment.

In FIG. 4, the double-gate TFT 40 has a substrate 41, gate electrode 42, gate insulating film 43, source electrode 44, drain electrode 45, semiconductor layer 46, insulating film 47, and back-gate electrode 48.

The substrate 41 is made of glass, for example, and as shown in FIG. 4, the gate electrode 42 is formed on the substrate 41. Furthermore, the gate insulating film 43 is formed on the gate electrode 42 in contact therewith.

The semiconductor layer 46 is made of an oxide semiconductor such as In—Ga—Zn—O, for example, and is formed on the gate insulating film 43. The source electrode 44 and drain electrode 45 are respectively formed on both sides of this semiconductor layer 46. In other words, the semiconductor layer 46 is disposed between the drain electrode 45 and the source electrode 44. It should be noted that the semiconductor layer 46, source electrode 44, and drain electrode 45 are formed in contact with the gate insulating film 43.

Moreover, the insulating film 47 (insulating layer) is formed on the semiconductor layer 46, source electrode 44, and drain electrode 45 in contact therewith, and the back-gate electrode 48 is formed in a position on this insulating film 47 opposing the gate electrode 42. Namely, the back-gate electrode 48 faces the gate electrode 42 across the semiconductor layer 46 and is formed via the insulating film 47. The double-gate TFT 40 described above is formed using a photolithography process.

It should be noted that the back-gate electrode 48 is formed as the same layer as the transparent conductive film (transparent electrode) formed in the pixel units PIX described above. This makes it possible for the double-gate TFT 40 of the present embodiment to be formed without needing an additional process step.

Next, the operation of the shift register circuit 1 and the SR unit circuit 10 of Embodiment 1 will be described with reference to the drawings.

First, the operation of the shift register circuit 1 of the present embodiment will be described with reference to FIG. 5.

Figure 5:
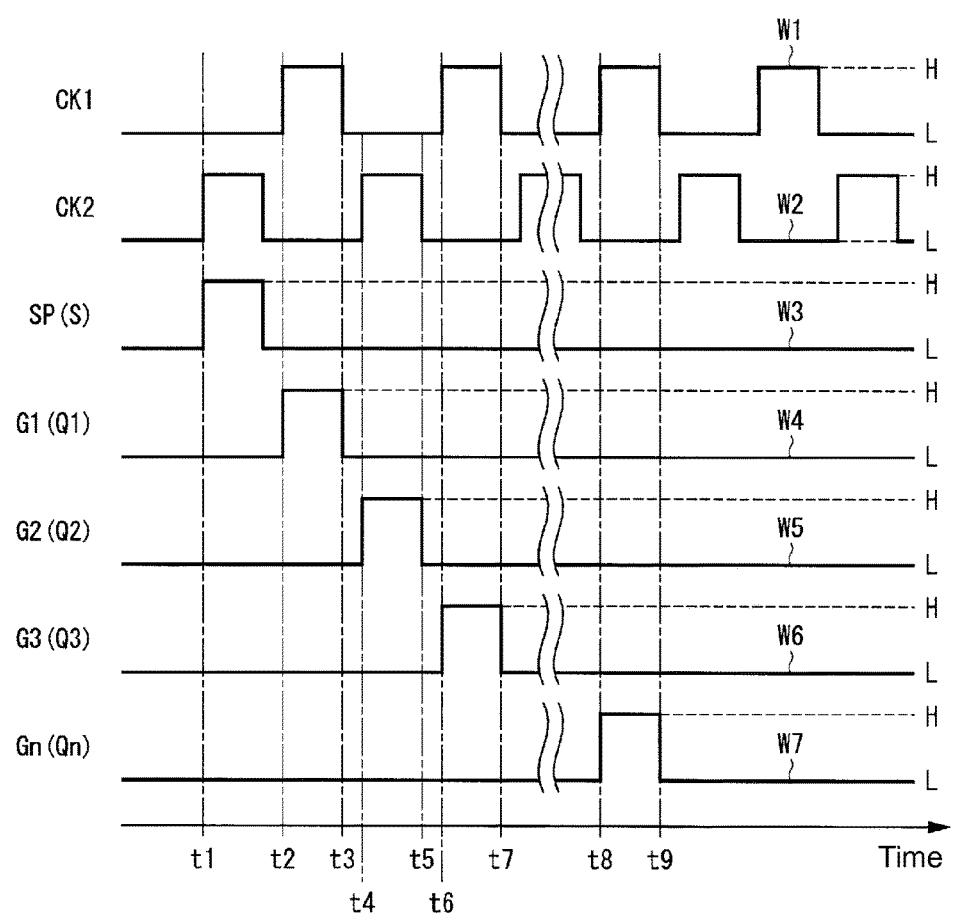
FIG. 5 is a time chart of one example of operation of the shift register circuit according to Embodiment 1.

FIG. 5 is a time chart of one example of operation of the shift register circuit 1 according to Embodiment 1.

In FIG. 5, waveforms W1 to W3 respectively represent a voltage waveform of the clock signal CK1, a voltage waveform of the clock signal CK2, and a voltage waveform of the start pulse signal SP. In addition, the waveforms W4 to W7 respectively represent voltage waveforms of the gate signals G1 to G3, and a voltage waveform of the gate signal Gn. Furthermore, in FIG. 5, the horizontal axis is time and the vertical axis is the signal level (voltage) for each of the waveforms.

In this example, the start pulse signal SP corresponds to the input pulse signal S (FIG. 3) in the SR unit circuit 10_1, and the gate signal G1 corresponds to the output signal Q in the SR unit circuit 10_1 and the input pulse signal S in the SR unit circuit 10_2. The gate signal G2 corresponds to the output signal Q in the SR unit circuit 10_2, the input pulse signal S in the SR unit circuit 10_3, and the reset signal R in the SR unit circuit 10_1. In a similar manner, the gate signal G3 corresponds to the output signal Q in the SR unit circuit 10_3, the input pulse signal S in the SR unit circuit 10_4, and the reset signal R in the SR unit circuit 10_2. Furthermore, the gate signal Gn corresponds to the output signal Q in the $n^{th}$ SR unit circuit 10.

It should be noted that, in the drawing, "H" is a voltage at which the logic state is high (H level), and "L" is a voltage at which the logic state is low (L level).

As shown in FIG. 5, first, at time t1, when the start pulse signal SP has transitioned from L level to H level (see waveform W3), the shift register circuit 1 begins shift operation.

Next, in accordance with the rise of the first clock signal CK1 at time t2 after the rise of the start pulse signal SP, the shift register circuit 1 causes the gate signal G1 (see waveform W4) to transition from L level to H level, and outputs a pulse signal as the gate signal G1. It should be noted that the scan line GL1, which is the signal line of the gate signal G1, is connected to the output terminal of the input pulse signal S of the next SR unit circuit 10, and this pulse signal acts as the input pulse signal S of the next SR unit circuit 10 (SR unit circuit 10_2).

Next, at time t3, in accordance with the fall of the clock signal CK1, the shift register circuit 1 causes the gate signal G1 to transition from H level to L level.

Then, at time t4, in accordance with the rise of the first clock signal CK2 following the rise of the gate signal G1, the shift register circuit 1 causes the gate signal G2 (see waveform W5) to transition from L level to H level, and outputs the pulse signal as the gate signal G2. It should be noted that the scan line GL2, which is the signal line of the gate signal G2, is connected to the output terminal of the input pulse signal S of the next SR unit circuit 10, and this pulse signal acts as the input pulse signal S of the next SR unit circuit 10 (SR unit circuit 10_3).

Next, at time t5, in accordance with the fall of the clock signal CK2, the shift register circuit 1 causes the gate signal G2 to transition from H level to L level.

Then, at time t6, in accordance with the rise of the first clock signal CK1 following the rise of the gate signal G2, the shift register circuit 1 causes the gate signal G3 (see waveform W6) to transition from L level to H level, and outputs the pulse signal as the gate signal G3. It should be noted that the scan line GL3, which is the signal line of the gate signal G3, is connected to the output terminal of the input pulse signal S of the next SR unit circuit 10, and this pulse signal acts as the input pulse signal S of the next SR unit circuit 10 (SR unit circuit 10_4).

Next, at time t7, in accordance with the fall of the clock signal CK1, the shift register circuit 1 causes the gate signal G3 to transition from H level to L level.

Thereafter, in accordance with the rise of the clock signal CK2 or the rise of the clock signal CK1, the shift register circuit 1 sequentially outputs the pulse signals as the gate signals. In the period from time t8 to time t9 (the period when the clock signal CK1 is H level), the shift register circuit 1 outputs the pulse signal as the gate signal Gn (see waveform W7), for example.

In this manner, the shift register circuit 1 sequentially outputs the input pulse signals (start pulse signals SP) as output signals in accordance with the clock signals (CK1 and CK2).

Next, the operation of the SR unit circuit 10 of the present embodiment will be described with reference to FIG. 6.

Figure 6:
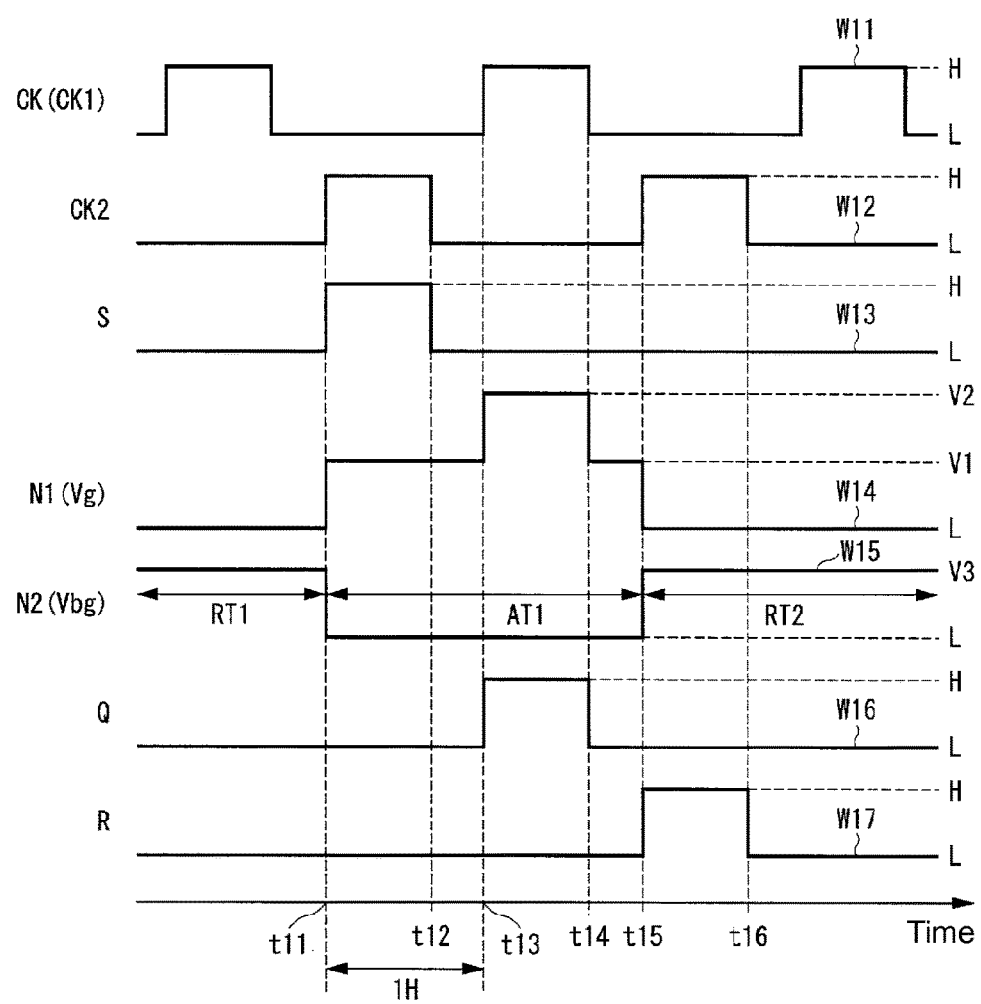
FIG. 6 is a time chart of one example of operation of the SR unit circuit according to Embodiment 1.

FIG. 6 is a time chart of one example of operation of the SR unit circuit 10 according to Embodiment 1.

In FIG. 6, the waveforms W11 to W17 respectively represent a voltage waveform of the clock signal CK (CK1), a voltage waveform of the clock signal CK2, a voltage waveform of the input pulse signal S, a voltage waveform of the node N1, a voltage waveform of the node N2, a voltage waveform of the output signal Q, and a voltage waveform of the reset signal R. Furthermore, in FIG. 6, the horizontal axis is time and the vertical axis is the signal level (voltage) for each of the waveforms.

It should be noted that, in the drawing, "H" is a voltage at which the logic state is high (H level), and "L" is a voltage at which the logic state is low (L level). Furthermore, voltage V1 is a voltage that has been lowered in an amount equal to the threshold voltage of the TFT 11 from the H level supplied to the signal line of the input pulse signal S. Voltage V2 is a voltage that is higher than voltage V1 due to the bootstrap operation of the capacitor 30, and is also higher than "the voltage representing the H state of the clock signal CK+ the threshold voltage of the TFT 15bg." Furthermore, voltage V3 is a voltage that has been lowered in an amount equal to the threshold voltage of the TFT 13 from the power-supply voltage vdd supplied to the power supply line Lvdd.

In this example, the voltage of the node N1 corresponds to the voltage (gate voltage Vg) applied to the gate electrode 42 of the TFT 15bg, and the voltage of the node N2 corresponds to the voltage (back-gate voltage Vbg) applied to the back-gate electrode 48 of the TFT 15bg.

In this example, the initial state of the respective signals described above is L level for the clock signals (CK1 and CK2), input pulse signal S, node N1, output signal Q, reset signal R, and is voltage V1 supplied to the node N2 from the TFT 13.

As shown in FIG. 6, first, at time t11, when the input pulse signal S transitions from L level to H level, the TFT 11 of the SR unit circuit 10 pre-charges the node N1 (see waveform W14). In other words, in such a case, the TFT 11 becomes conductive, and supplies the abovementioned voltage V1 to the node N1. It should be noted that this voltage V1 is lower than H level, but is the H state in a binary logic state. Furthermore, this causes the node N1 to be H state, which makes the TFT 14 become conductive, and the TFT 14 causes the node N2 to transition from voltage V3 to L level (see waveform 15).

Moreover, the node N1 becoming voltage V1 (H state) causes the voltage representing the H state to be applied to the gate terminal (gate electrode 42) of the TFT 15bg. In addition, the node N2 becoming L level causes the voltage representing the L state to be applied to the gate terminal of the TFT 16 and the back-gate terminal (back-gate electrode 48) of the TFT 15bg. As a result, the TFT 15bg becomes conductive, and the TFT 16 becomes non-conductive. It should be noted that, at time t11, the TFT 15bg is conductive, but the clock signal CK (CK1) is L level; thus, the SR unit circuit 10 outputs L level to the output terminal To. In other words, the output signal Q is maintained at L level.

Next, at time t12, the input pulse signal S transitions from H level to L level. This causes the TFT 11 to become non-conductive, and the TFT 11 stops pre-charging of the node N1. It should be noted that the input terminal of the input pulse signal S is connected to the output terminal To of the output signal Q of the previous SR unit circuit 10. The previous SR unit circuit 10 outputs the output signal Q in synchronization with the clock signal CK2; therefore, the input pulse signal S transitions in synchronization with the clock signal CK2.

Next, at time t13, if the clock signal CK1 transitions from L level to H level, the TFT 15bg starts to output H level to the output terminal To. In such a case, in accordance with the output terminal To transitioning from L level to H level, the voltage of the node N1 is stepped-up to voltage V2 via the capacitor 30 (bootstrap operation). This bootstrap operation causes the TFT 15bg to transmit H level of the clock signal CK to the output terminal To without voltage loss.

Next, at time t14, if the clock signal CK transitions from H level to L level, the TFT 15bg starts to output L level to the output terminal To. In such a case, in accordance with the output terminal To transitioning from H level to L level, the voltage of the node N1 is stepped-down to voltage V1 via the capacitor 30.

In this manner, the SR unit circuit 10, in the period from time t13 to time t14, outputs a pulse signal to the output terminal To of the output signal Q, as shown by waveform W16.

Next, at time t15, when the reset signal R transitions from L level to H level, the TFT 12 becomes conductive. The TFT 12 begins to discharge and sets the node N1 to L level. This causes the node N1 to be L level (L state), which makes the TFT 14 become non-conductive, and the TFT 14 causes the node N2 to transition from L level to voltage V3 (see waveform W15).

Moreover, the node N1 becoming L level (L state) causes a voltage representing the L state to be applied to the gate terminal (gate electrode 42) of the TFT 15bg. In addition, the node N2 becoming voltage V3 causes a voltage representing the H state to be applied to the gate terminal of the TFT 16 and the back-gate terminal (back-gate electrode 48) of the TFT 15*bg*. As a result, the TFT 15*bg* becomes non-conductive, and the TFT 16 becomes conductive. This causes the SR unit circuit 10 to output L level to the output terminal To. In other words, the output signal Q is maintained at L level.

Next, at time t16, the reset signal R transitions from H level to L level. This causes the TFT 11 to become non-conductive, and the TFT 11 stops discharging of the node N1. It should be noted that the input terminal of the reset signal R is connected to the output terminal To of the output signal Q of the following (subsequent) SR unit circuit 10. The following SR unit circuit 10 outputs the pulse signal to the output terminal To of the output signal Q in synchronization with the clock signal CK2; therefore, the reset signal R transitions in synchronization with the clock signal CK2.

It should be noted that, in FIG. 6, the period from time t11 to t13 corresponds to 1H period T1H (one horizontal line data write period) of the display device 100.

In the example shown in FIG. 6, in the period RT1 before time t11 and the period RT2 after time t15, a voltage representing the L state is applied to the gate electrode 42 of the TFT 15*bg*, and a voltage representing the H state is applied to the back-gate electrode 48 of the TFT 15*bg*. In other words, the SR unit circuit 10, when applying a voltage representing the L state to the gate electrode 42, applies a voltage representing the H state to the back-gate electrode 48.

Furthermore, in the period AT1 from time t11 to time t15, a voltage representing the H state is applied to the gate electrode 42 of the TFT 15*bg*, and a voltage representing the L state is applied to the back-gate electrode 48 of the TFT 15*bg*. Namely, the SR unit circuit 10, when applying a voltage representing the H state to the gate electrode 42, applies a voltage representing the L state to the back-gate electrode 48.

In this manner, the back gate electrode 48 of the TFT 15*bg* is connected to the internal node (in this example, node N2) in the same SR unit circuit 10 such that the voltage to be applied thereto represents the logic state that is the inverse of the logic state of the voltage applied to the gate electrode 42.

Next, the control of the double-gate TFT 40 constituting the TFT 15*bg* of the present embodiment will be explained with reference to FIGS. 7 to 10.

The shift register circuit 1 and the SR unit circuit 10 of the present embodiment apply differing voltages to the back-gate electrode 48 depending on whether the double-gate TFT 40 is operational (conductive) or non-operational (non-conductive). In other words, the SR unit circuit 10 performs control to apply a prescribed voltage to the back-gate electrode 48 in accordance with the voltage applied to the gate electrode 42.

Figure 7:
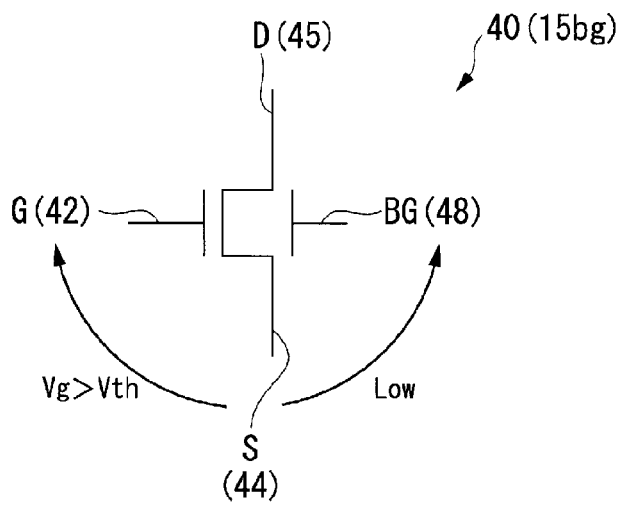
FIG. 7 is a view of one example of control of the double-gate TFT during operation according to the present embodiment.

FIG. 7 is a view of one example of control of the double-gate TFT 40 during operation according to the present embodiment.

In FIG. 7, the source terminal (S) of the TFT 40 corresponds to the source electrode 44, and the drain terminal (D) of the TFT 40 corresponds to the drain electrode 45. Furthermore, the gate terminal (G) of the TFT 40 corresponds to the gate electrode 42, and the back-gate terminal (BG) of the TFT 40 corresponds to the back-gate electrode 48. It should be noted that, in the present embodiment, the double-gate TFT 40 corresponds to the TFT 15*bg* in FIG. 3.

In this example, the "operational state" of the double-gate TFT 40 is a state in which the double-gate TFT 40 is operating, or rather, a state in which the area between the source electrode 44 and the drain electrode 45 is conductive (i.e., in a conductive state). In the operational state (conductive state), with regard to the TFT 40, a prescribed voltage is applied to the gate terminal (G) such that the voltage Vg of the gate terminal (G) relative to the source terminal (S) becomes greater than the threshold voltage (Vth) (Vg>Vth). Specifically, the SR unit circuit 10, in this operational state, applies a voltage in which the logic state is the high state (H level) to the gate terminal (G) of the TFT 40.

In addition, in the operational state (conductive state), with regard to the TFT 40, a prescribed voltage is applied to the back-gate terminal (BG) such that the voltage Vbg of the back-gate terminal (BG) relative to the source terminal (S) becomes less than or equal to the threshold voltage (Vth) (Vbg≤Vth). Specifically, the SR unit circuit 10, in this operational state, applies a voltage in which the logic state is the low state (L level) to the back-gate terminal (BG) of the TFT 40.

In other words, the SR unit circuit 10, when applying the voltage in which the logic state is the high state to the gate electrode 42, applies the voltage in which the logic state is the low state to the back-gate electrode 48. In the example in FIG. 6, the voltage Vg corresponds to the voltage of the node N1 (waveform W14), and the voltage Vbg corresponds to the voltage of the node N2 (waveform W15), for example; thus, the period AT1 corresponds to this operational state.

Figure 8:
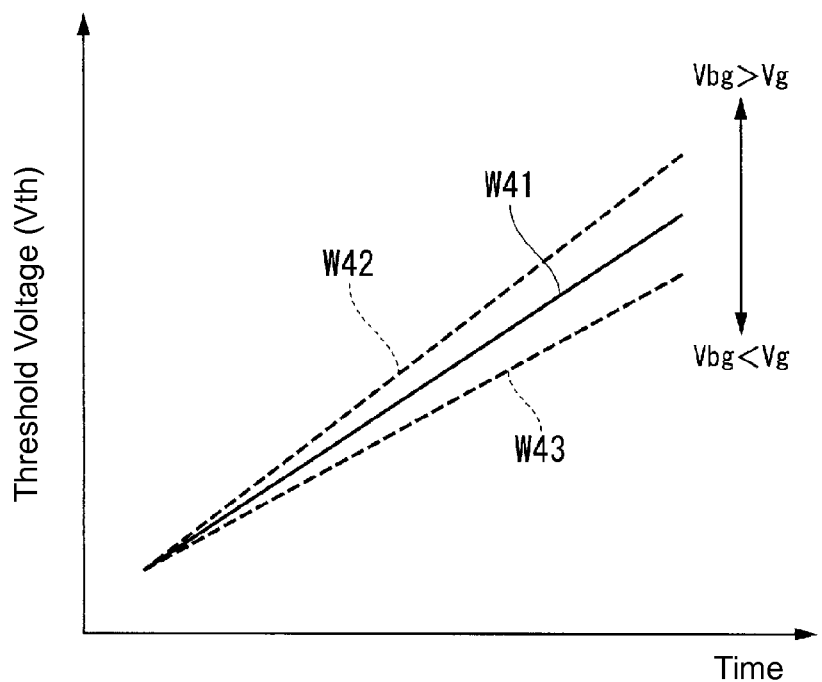
FIG. 8 is a view of one example of changes in threshold of the double-gate TFT during operation according to the present embodiment.

As shown in FIG. 8, by controlling in this manner, fluctuations in the threshold voltage Vth of the TFT 40 can be suppressed.

FIG. 8 is a view of one example of changes in threshold of the double-gate TFT 40 during operation according to the present embodiment.

In FIG. 8, the graph shows the relationship between passage of time in the operational state of the TFT 40 and the threshold voltage (Vth). In this graph, the vertical axis is the threshold voltage (Vth) of the TFT 40, and the horizontal axis is passage of time in the operational state shown logarithmically.

The waveform W41 shows changes in the threshold voltage when a voltage is not applied to the back-gate terminal (BG) in the operational state. The waveform W42 shows changes in the threshold voltage when the voltage Vbg of the back-gate terminal (BG) is greater than the voltage Vg in the operational state (Vbg>Vg). The waveform W43 shows changes in the threshold voltage when the voltage Vbg of the back-gate terminal (BG) is less than the voltage Vg in the operational state (Vbg<Vg).

In general, in the operational state, TFTs receive plus voltage stress on the gate electrode, which gradually causes the threshold voltage (Vth) to shift to plus over time. The double-gate TFT 40 of the present embodiment, however, has changes in the amount of shift in threshold voltage in accordance with the voltage applied to the gate electrode 48 in the operational state, as shown in FIG. 8. When the voltage Vbg of the back-gate terminal (BG) is greater than the voltage Vg (waveform W42), the amount of shift in threshold voltage becomes greater than when voltage is not applied to the back-gate terminal (BG) (waveform W41), for example. Furthermore, when the voltage Vbg of the back-gate terminal (BG) is less than the voltage Vg (waveform W43), the amount of shift in the threshold voltage becomes less than when voltage is not applied to the back-gate terminal (BG) (waveform W41).

It should be noted that voltage not being applied to the back-gate terminal (BG) (waveform W41) corresponds to ordinary TFTs (TFT 11 and the like, for example) that do not have the back-gate electrode 48.

As shown in FIGS. 6 and 7, the SR unit circuit 10 of the present embodiment, when applying a voltage representing the H state to the gate electrode 42, applies a voltage representing the L state to the back-gate electrode 48 (period AT1 in FIG. 6). Therefore, the TFT 40 has a voltage representing the L state applied to the back-gate electrode 48 during the operational state. In other words, in order to correspond to the case in which the voltage Vbg of the above-mentioned back-gate terminal (BG) is less than the voltage Vg (waveform W43), the SR unit circuit 10 controls the voltage applied to the back-gate electrode 48. Thus, the SR unit circuit 10 of the present embodiment, in the operational state, can suppress the amount of shift in threshold voltage. In other words, the SR unit circuit 10 can reduce characteristic degradation caused by fluctuations in the threshold voltage of the TFT 40.

Figure 9:
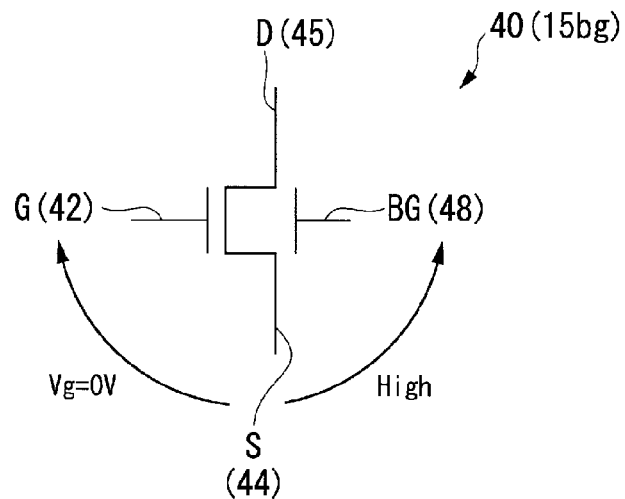
FIG. 9 is a view of one example of control of the double-gate TFT during non-operation according to the present embodiment.

FIG. 9 is a view of one example of control of the double-gate TFT 40 during the non-operational state thereof.

In FIG. 9, the source terminal (S) of the TFT 40 corresponds to the source electrode 44, and the drain terminal (D) of the TFT 40 corresponds to the drain electrode 45. Furthermore, the gate terminal (G) of the TFT 40 corresponds to the gate electrode 42, and the back-gate terminal (BG) of the TFT 40 corresponds to the back-gate electrode 48.

In this example, the "non-operational state" of the double-gate TFT 40 is a state in which the double-gate TFT 40 is not operating, or rather, a state in which the area between the source electrode 44 and the drain electrode 45 is not conductive (non-conductive state). In the non-operational state (non-conductive state), the TFT 40 has a prescribed voltage applied to the gate terminal (G) such that the voltage Vg of the gate terminal (G) relative to the source terminal (S) becomes 0V (Vg=0V), for example. Specifically, the SR unit circuit 10, in this non-operational state, applies a voltage in which the logic state is the low state (L level) to the gate terminal (G) of the TFT 40.

In addition, in this non-operational state (non-conductive state), the TFT 40 has a prescribed voltage applied to the back-gate terminal (BG) such that the voltage Vbg of the back-gate terminal (BG) relative to the source terminal (S) becomes greater than 0V (Vbg>0V). Specifically, the SR unit circuit 10, in this non-operational state, applies a voltage in which the logic state is the high state (H level) to the back-gate terminal (BG) of the TFT 40.

In other words, the SR unit circuit 10, when applying a voltage in which the logic state is the low state to the gate electrode 42, applies a voltage in which the logic state is the high state to the back-gate electrode 48. In the example in FIG. 6, the voltage Vg corresponds to the voltage of the node N1 (waveform W14), and the voltage Vbg corresponds to the voltage of the node N2 (waveform W15), for example; thus, the periods RT1 and RT2 correspond to this non-operational state.

Figure 10:
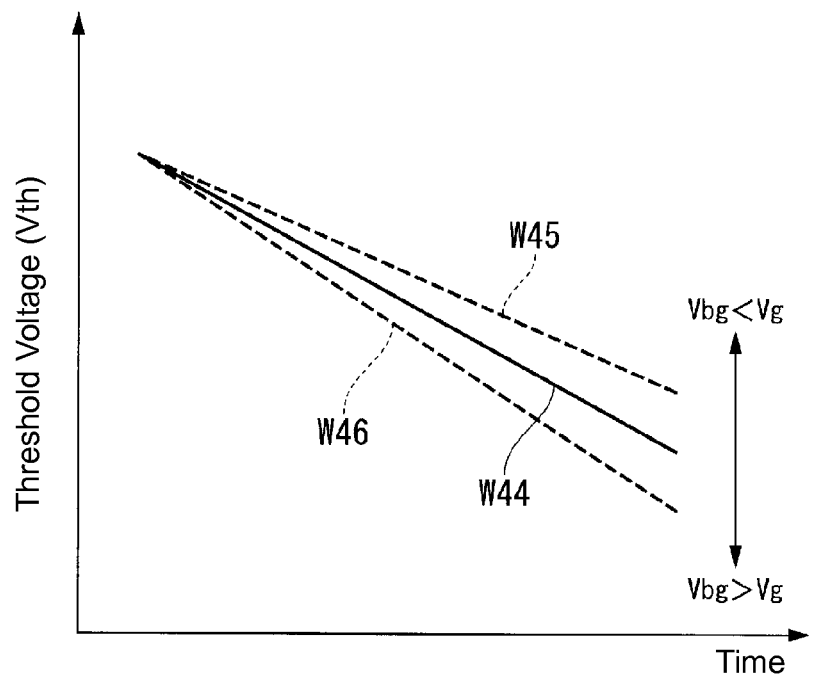
FIG. 10 is a view of one example of changes in threshold of the double-gate TFT during non-operation according to the present embodiment.

As shown in FIG. 10, controlling in this manner promotes recovery of the threshold voltage (Vth) of the TFT 40, which has shifted towards plus.

FIG. 10 is a view of one example of change in threshold during the non-operational state of the double-gate TFT 40 of the present embodiment.

In FIG. 10, the graph shows the relationship between passage of time in the non-operational state of the TFT 40 and the threshold voltage (Vth). In this graph, the vertical axis is the threshold voltage (Vth) of the TFT 40, and the horizontal axis is passage of time in the non-operational state shown logarithmically.

Furthermore, the waveform W44 shows changes in threshold voltage when no voltage is applied to the back-gate terminal (BG) in the non-operational state. The waveform W45 shows changes in the threshold voltage when the voltage Vbg of the back-gate terminal (BG) is less than the voltage Vg in the non-operational state (Vbg<Vg). The waveform W46 shows changes in the threshold voltage when the voltage Vbg of the back-gate terminal (BG) is greater than the voltage Vg in the non-operational state (Vbg>Vg).

In general, in the non-operational state, TFTs do not receive voltage stress when a voltage of 0V is being applied to the gate electrode (Vg=0V). If this state of not receiving voltage stress continues, TFTs using an oxide semiconductor such as In—Ga—Zn—O or the like tend to have a gradual recovery in the threshold voltage (Vth) shifts following passage of time. In other words, the threshold voltage (Vth) that has shifted to plus in the operational state gradually shifts towards minus and attempts to return to the initial threshold voltage (Vth) during the non-operational state.

As shown in FIG. 10, however, the double-gate TFT 40 of the present embodiment, in the non-operational state, has changes in the recovery amount of the threshold voltage in accordance with the voltage applied to the back-gate electrode 48. When the voltage Vbg of the back-gate terminal (BG) is less than the voltage Vg (waveform W45), the recovery amount of the threshold voltage becomes less than when voltage is not applied to the back-gate terminal (BG) (waveform W44), for example. When the voltage Vbg of the back-gate terminal (BG) is greater than the voltage Vg (waveform W46), the recovery amount of the threshold voltage becomes greater than when voltage is not applied to the back-gate terminal (BG) (waveform W44).

It should be noted that voltage not being applied to the back-gate terminal (BG) (waveform W44) corresponds to ordinary TFTs (TFT 11 and the like, for example) that do not have the back-gate electrode 48.

As shown in FIGS. 6 and 8, the SR unit circuit 10 of the present embodiment, when applying a voltage representing the L state to the gate electrode 42, applies a voltage representing the H state to the back-gate electrode 48 (periods RT1 and RT2 in FIG. 6). Thus, the TFT 40, in the non-operational state, has a voltage representing the H state applied to the back-gate electrode 48. In other words, in order to correspond to the case in which the voltage Vbg of the above-mentioned back-gate terminal (BG) is greater than the voltage Vg (waveform W46), the SR unit circuit 10 controls the voltage applied to the back-gate electrode 48. Thus, the SR unit circuit 10 of the present embodiment, in the non-operational state, can promote recovery of the threshold voltage. Namely, the SR unit circuit 10 can reduce characteristic degradation in which the threshold voltage of the TFT 40 fluctuates.

As described above, the shift register circuit 1 of the present embodiment has a plurality of the cascade-connected SR unit circuits 10 (unit circuits), which output the input pulse signals as output signals in accordance with the clock signals, and the shift register circuit 1 sequentially outputs the output signals from the respective SR unit circuits 10. The SR unit circuit 10 includes the double-gate transistor (TFT 40 (TFT 15bg)) that has the gate electrode 42 (first gate electrode), and the back-gate electrode 48 (second gate electrode) formed via the insulating film 47. In this example, the gate electrode 42 controls the conductivity between the drain electrode 45 and the source electrode 44. Furthermore, the back-gate electrode 48 is disposed to face the gate electrode 42 across the semiconductor layer 46 between the drain electrode 45 and the source electrode 44. In addition, the SR unit circuit 10 applies a prescribed voltage to the back-gate electrode 48 in accordance with the voltage applied to the gate electrode 42.

As described with reference to FIGS. 6 to 10, applying a prescribed voltage to the back-gate electrode 48 makes it possible to reduce the amount of shift in threshold voltage of the TFT 15*bg* during the operational state thereof, for example. This can also promote recovery of the threshold voltage of the TFT 15*bg* in the non-operational state thereof, for example. In other words, the shift register circuit 1 of the present embodiment can suppress characteristic degradation and promote characteristic recovery of the TFT 40 (TFT 15*bg*). Accordingly, the shift register circuit 1 of the present embodiment can reduce characteristic degradation. This allows the shift register circuit 1 of the present embodiment to realize a scan line drive circuit 102 (drive circuit) and a display device 100 that are both more reliable than conventional configurations.

Moreover, as described above, because the shift register circuit 1 of the present embodiment can suppress characteristic degradation and promote recovery of the TFT 40 (TFT 15*bg*), this shift register circuit makes it easier to secure operation margin as compared to conventional shift register circuits. Therefore, the shift register circuit 1 of the present embodiment can reduce the size of the TFT 40. This allows the shift register circuit 1 of the present embodiment to realize a display device 100 that has a smaller frame size than conventional configurations. Furthermore, since the size of the TFT 40 can be reduced, the shift register circuit 1 of the present embodiment enables a reduction in power consumption of the display device 100 as compared to conventional configurations.

In addition, in the present embodiment, the SR unit circuit 10, when applying the voltage in which the logic state is the high state to the gate electrode 42, applies the voltage in which the logic state is the low state to the back-gate electrode 48.

This makes it possible to suppress the amount of shift in threshold voltage during the operational state of the TFT 40. Accordingly, the shift register circuit 1 of the present embodiment can reduce characteristic degradation in which the threshold voltage of the TFT 40 fluctuates.

In addition, in the present embodiment, the SR unit circuit 10, when applying the voltage in which the logic state is the low state to the gate electrode 42, applies the voltage in which the logic state is the high state to the back-gate electrode 48.

This makes it possible to promote recovery from the shifts in threshold voltage in the non-operational state of the TFT 40. Accordingly, the shift register circuit 1 of the present embodiment can reduce characteristic degradation in which the threshold voltage of the TFT 40 fluctuates.

Furthermore, in the present embodiment, the SR unit circuit 10 includes the TFT 15*bg* (output transistor). The TFT 15*bg* is connected to the output terminal To, which outputs the output signal Q, and the TFT outputs a pulse signal. In addition, at least the TFT 15*bg* is a double-gate transistor (TFT 40).

This allows the shift register circuit 1 of the present embodiment to suppress voltage drops of the gate signal (Gn) that is output to the scan line (GLn) caused by characteristic degradation of the TFT 15*bg*. Thus, the shift register circuit 1 of the present embodiment can realize a display device 100 that is more reliable than conventional configurations.

In addition, in the present embodiment, the back-gate electrode 48 of the TFT 15*bg* (output transistor) is connected to the internal node (node N2, for example) of the same SR unit circuit 10 such that the voltage to be applied thereto represents the logic state that is the inverse of the logic state of the voltage applied to the gate electrode 42.

This makes it possible for the shift register circuit 1 of the present embodiment to simply and reliably suppress characteristic degradation and promote recovery of the TFT 40 (TFT 15*bg*).

Furthermore, in the present embodiment, the back-gate electrode 48 (second gate electrode) of the TFT 40 is a transparent electrode.

This makes it possible, in regards to the shift register circuit 1 of the present embodiment, for the double-gate TFT 40 to be formed without requiring an additional process step.

The scan line drive circuit 102 (drive circuit) of the present embodiment includes the shift register circuit 1.

Due to this, the scan line drive circuit 102 of the present embodiment exhibits similar effects to the shift register circuit 1.

In addition, the display device 100 of the present embodiment includes the scan line drive circuit 102 (drive circuit).

Due to this, the display device 100 of the present embodiment exhibits similar effects to the shift register circuit 1. In other words, the display device 100 of the present embodiment can reduce characteristic degradation and increase reliability more than in conventional configurations.

Next, the operation of the shift register circuit 1 of Embodiment 2 will be described with reference to the drawings.

Embodiment 2

The shift register circuit 1 according to Embodiment 2 differs from the shift register circuit of Embodiment 1 in that the connection point for the back-gate electrode 48 of the TFT 15*bg* is the signal line of the reset signal R. The shift register circuit 1 of the present embodiment is similar to Embodiment 1 except in that the SR unit circuit 10 shown in FIG. 1 has been changed to SR unit circuit 10*a*, and thus repetitive explanations will be omitted. It should be noted that the configuration of the display device 100 of the present embodiment is similar to Embodiment 1 shown in FIG. 1, and thus an explanation thereof will be omitted.

Figure 11:
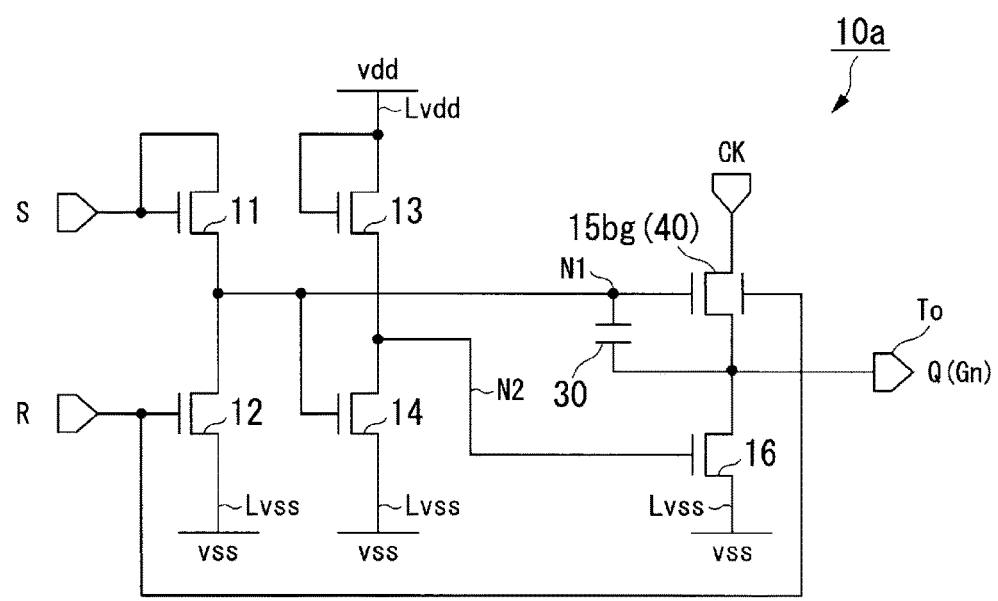
FIG. 11 is a schematic block view of one example of a SR unit circuit according to Embodiment 2.

FIG. 11 is a schematic block view of one example of the SR unit circuit 10*a* in Embodiment 2.

In FIG. 11, the SR unit circuit 10*a* includes TFTs (11 to 14, 15*bg*, 16), and a capacitor 30. In FIG. 11, configurations that are the same as FIG. 3 are given the same reference characters, and an explanation thereof will not be repeated.

It should be noted that, in the present embodiment, as described above, the connection point of the back-gate electrode 48 of the TFT 15*bg* being the signal line of the reset signal R differs from the SR unit circuit 10 of Embodiment 1 shown in FIG. 3. In other words, in the present embodiment, the back-gate electrode 48 of the TFT 15*bg* is connected to the output terminal To (signal line of the reset signal R) of the other SR unit circuits 10*a* (the next SR unit circuit 10*a*, for example).

Next, the operation of the shift register circuit 1 and the SR unit circuit 10*a* of Embodiment 2 will be described with reference to the drawings.

The operation of the shift register circuit 1 of the present embodiment is similar to Embodiment 1 shown in FIG. 5, and thus an explanation thereof will be omitted.

The operation of the SR unit circuit 10*a* of the present embodiment will be described with reference to FIG. 12.

Figure 12:
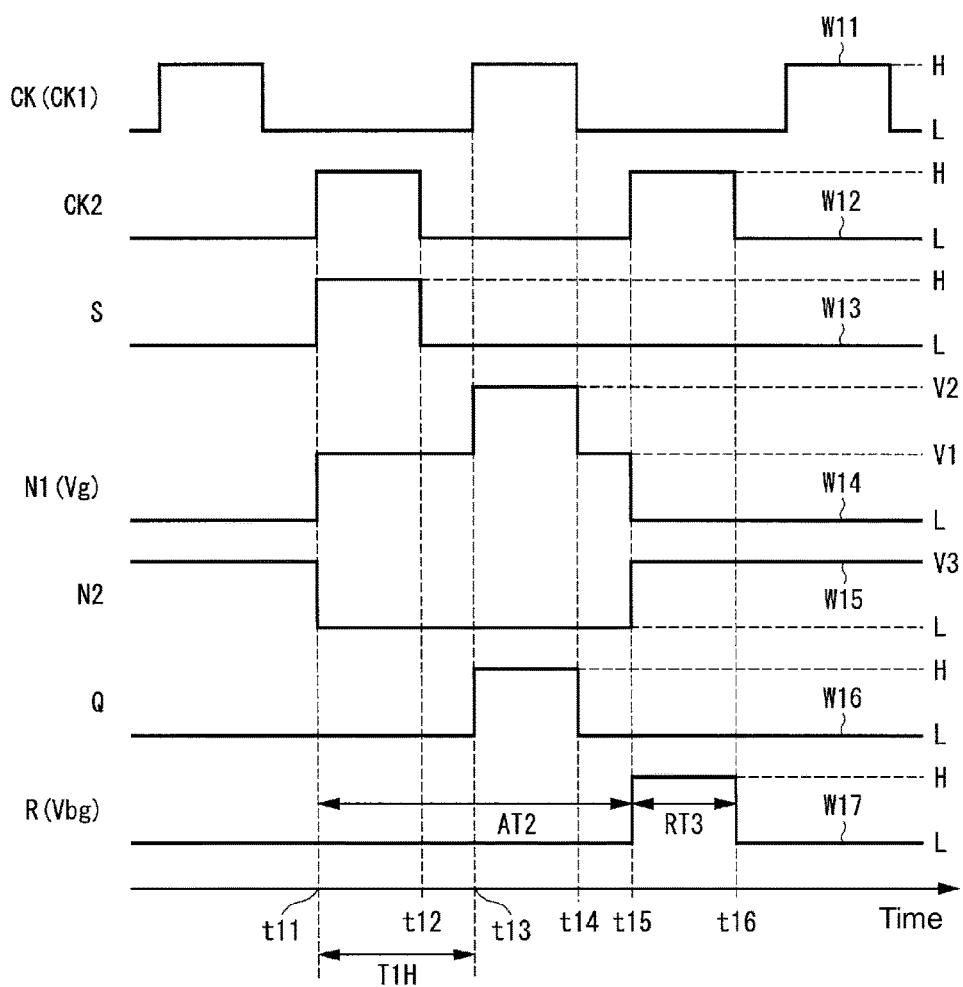
FIG. 12 is a time chart of one example of operation of the SR unit circuit according to Embodiment 2.

FIG. 12 is a time chart of one example of operation of the SR unit circuit 10*a* according to Embodiment 2.

In FIG. 12, the waveforms W11 to W17 are similar to FIG. 6. Furthermore, in FIG. 12, the horizontal axis is time, and the vertical axis is the signal level (voltage) of the respective waveforms.

The basic operation of the SR unit circuit 10a of the present embodiment from time t11 to time t16 is similar to Embodiment 1 shown in FIG. 6, and thus an explanation thereof will be omitted.

In the present embodiment, the voltage of the node N1 corresponds to the voltage (gate voltage Vg) applied to the gate electrode 42 of the TFT 15bg, and the voltage of the reset signal R corresponds to the voltage (back-gate voltage Vbg) applied to the back-gate electrode 48 of the TFT 15bg.

Therefore, in the example shown in FIG. 12, in the period RT3 from time t15 to time t16, the node N1 applies a voltage representing the L state to the gate electrode 42 of the TFT 15bg, and the reset signal R applies a voltage representing the H state to the back-gate electrode 48 of the TFT 15bg. In other words, the SR unit circuit 10a, when applying a voltage representing the L state to the gate electrode 42, applies a voltage representing the H state to the back-gate electrode 48.

In this manner, in the present embodiment, in period RT3, the SR unit circuit 10a performs control such that the TFT 15bg is in a non-operational state, and such that the voltage Vbg of the back-gate electrode 48 of the TFT 15bg becomes higher than the gate voltage Vg (Vbg>Vg). This makes it possible for the SR unit circuit 10a to promote recovery from shifts in threshold voltage of the TFT 15bg.

It should be noted that period RT3 is part of the period in which a voltage representing the L state is applied to the gate electrode 42. Thus, in the present embodiment, the SR unit circuit 10a, in part of the period when applying a voltage representing the L state to the gate electrode 42, applies a voltage representing the H state to the back-gate electrode 48.

In addition, in the period AT2 from time t11 to t15, the node N1 applies a voltage representing the H state to the gate electrode 42 of the TFT 15bg, and the reset signal R applies a voltage representing the L state to the back-gate electrode 48 of the TFT 15bg. In other words, the SR unit circuit 10a, when applying a voltage representing the H state to the gate electrode 42, applies a voltage representing the L state to the back-gate electrode 48.

In this manner, in the present embodiment, in period AT2, the SR unit circuit 10a performs control such that the TFT 15bg is in an operational state, and such that the voltage Vbg of the back-gate electrode 48 of the TFT 15bg becomes lower than the gate voltage Vg (Vbg<Vg). This makes it possible for the SR unit circuit 10a to suppress fluctuations (shifts) in the threshold voltage of the TFT 15bg.

As described above, according to the present embodiment, the back-gate electrode 48 of the TFT 15bg (output transistor) is connected to the output terminal To of another SR unit circuit 10a (the next SR unit circuit 10a, for example).

This makes it possible for the shift register circuit 1 of the present embodiment to simply and reliably suppress characteristic degradation and promote recovery of the TFT 40 (TFT 15bg), in a similar manner to Embodiment 1.

It should be noted that the voltage of the reset signal R applied to the back-gate electrode 48 of the TFT 15bg, when H state, is a higher voltage (the power-supply voltage vdd, for example) than voltage V3 of the node N2. Thus, the shift register circuit 1 of the present embodiment allows for a higher voltage than in Embodiment 1 to be applied to the back-gate electrode 48. Furthermore, the capacitance load of the node N2 can be reduced; thus, the shift register circuit 1 of the present embodiment can reduce the size of the TFT 13 and the TFT 14 more than in Embodiment 1.

In addition, in the present embodiment, the SR unit circuit 10a, in a part of the period when applying a voltage in which the logic state is the low state to the gate electrode 42, applies a voltage in which the logic state is the high state to the back-gate electrode 48.

This makes it possible, in the non-operational state of the TFT 40 (TFT 15bg), to promote recovery from shifts in the threshold voltage. Accordingly, the shift register circuit 1 of the present embodiment can reduce characteristic degradation caused by fluctuations in threshold voltage of the TFT 40 (TFT 15bg).

Next, the shift register circuit 1 of Embodiment 3 will be described with reference to the drawings.

Embodiment 3

A shift register circuit 1 of Embodiment 3 differs from Embodiment 1 in that, instead of the SR unit circuit 10, a SR unit circuit 10b that receives a clock signal CK and also receives a clock signal CKB having a differing phase from the clock signal CK is provided. It should be noted that the configuration of the display device 100 of the present embodiment is similar to Embodiment 1 shown in FIG. 1, and thus an explanation thereof will be omitted.

Figure 13:
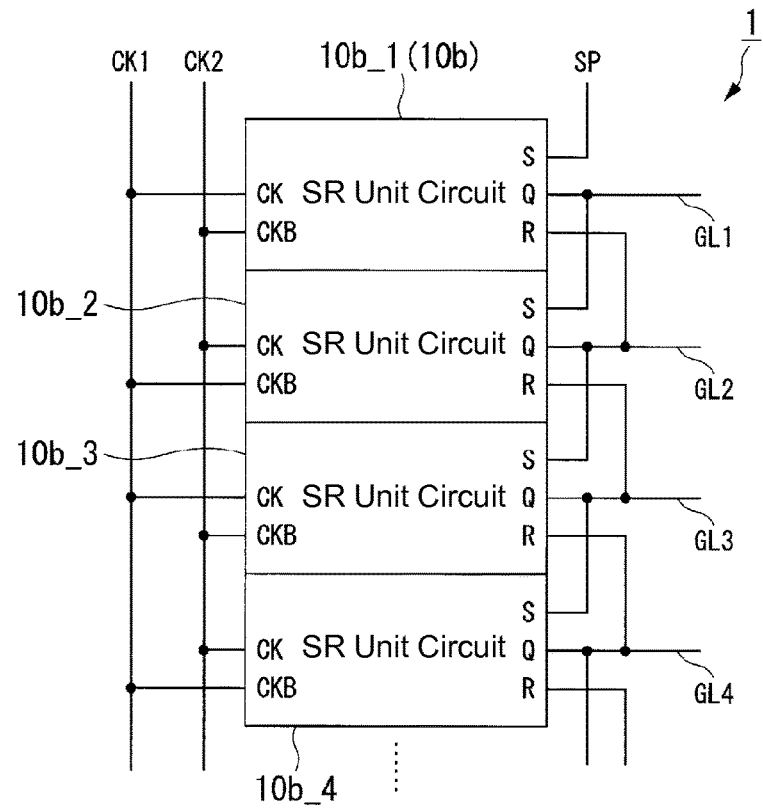
FIG. 13 is a schematic block view of one example of a shift register circuit according to Embodiment 3.

FIG. 13 is a schematic block view of one example of the shift register circuit 1 according to Embodiment 3.

In FIG. 13, the shift register circuit 1 includes a plurality of SR unit circuits 10b (10b_1, 10b_2, 10b_3, 10b_4, etc.). The shift register circuit 1 has a plurality of the SR unit circuits 10b cascade connected together and sequentially outputs, from the respective SR unit circuits 10b, a start pulse signal SP as an output signal in accordance with the clock signals (CK1 and CK2). In this example, the SR unit circuit 10b_1, SR unit circuit 10b_2, SR unit circuit 10b_3, SR unit circuit 10b_4, etc., each have the same configuration; thus, when not distinguishing among any particular SR unit circuit or the like, or when simply indicating the SR unit circuits of the shift register circuit 1, these SR unit circuits may be described as the SR unit circuit 10b.

It should be noted that, in the example shown in FIG. 13, the signal line for the clock signal CK1 is connected to the clock signal CK input terminal of the odd-numbered SR unit circuits 10b (SR unit circuit 10b_1, SR unit circuit 10_3b). Furthermore, the signal line for the clock signal CK2 is connected to the clock signal CK input terminals of the even-numbered SR unit circuits 10b (SR unit circuit 10b_2, SR unit circuit 10b_4). In this example, the clock signal CK1 and clock signal CK2 have mutually differing phases.

Furthermore, the signal line for the clock signal CK2 is connected to the clock signal CKB input terminals of the odd-numbered SR unit circuits 10b (SR unit circuit 10b_1, SR unit circuit 10b_3). Furthermore, the signal line for the clock signal CK1 is connected to the clock signal CKB input terminals of the even-numbered SR unit circuits 10b (SR unit circuit 10b_2, SR unit circuit 10b_4).

In FIG. 13, the other configurations of the shift register circuit 1 are similar to Embodiment 1 shown in FIG. 2; thus, an explanation thereof will be omitted.

Next, the configuration of the SR unit circuit 10b of the present embodiment will be described with reference to FIG. 14.

Figure 14:
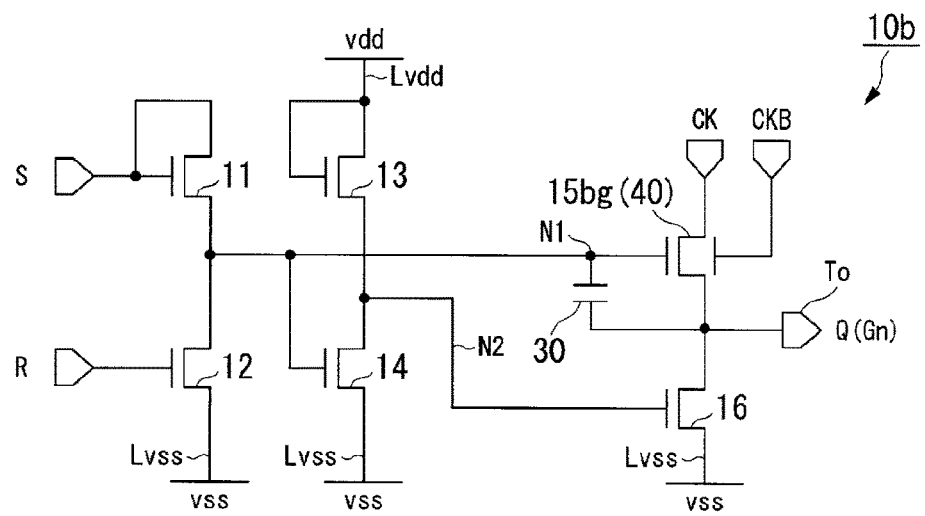
FIG. 14 is a schematic block view of one example of a SR unit circuit according to Embodiment 3.

FIG. 14 is a schematic block view of one example of the SR unit circuit 10b in Embodiment 3.

In FIG. 14, the SR unit circuit 10b includes TFTs (11 to 14, 15bg, 16) and a capacitor 30. In FIG. 14, configurations that are the same as FIG. 3 are given the same reference characters, and an explanation thereof will not be repeated.

It should be noted that, in the present embodiment, as described above, the connection point of the back-gate electrode 48 of the TFT 15bg being the signal line of the clock signal CKB differs from the SR unit circuit 10 of Embodiment 1 shown in FIG. 3. In other words, in the present embodiment, the back-gate electrode 48 of the TFT 15bg is connected to the clock signal CKB (second clock signal) having a differing phase from the clock signal CK.

Next, the operation of the shift register circuit 1 and the SR unit circuit 10b of Embodiment 3 will be described with reference to the drawings.

The operation of the shift register circuit 1 of the present embodiment is similar to Embodiment 1 shown in FIG. 5, and thus an explanation thereof will be omitted.

The operation of the SR unit circuit 10b of the present embodiment will be described with reference to FIG. 15.

Figure 15:
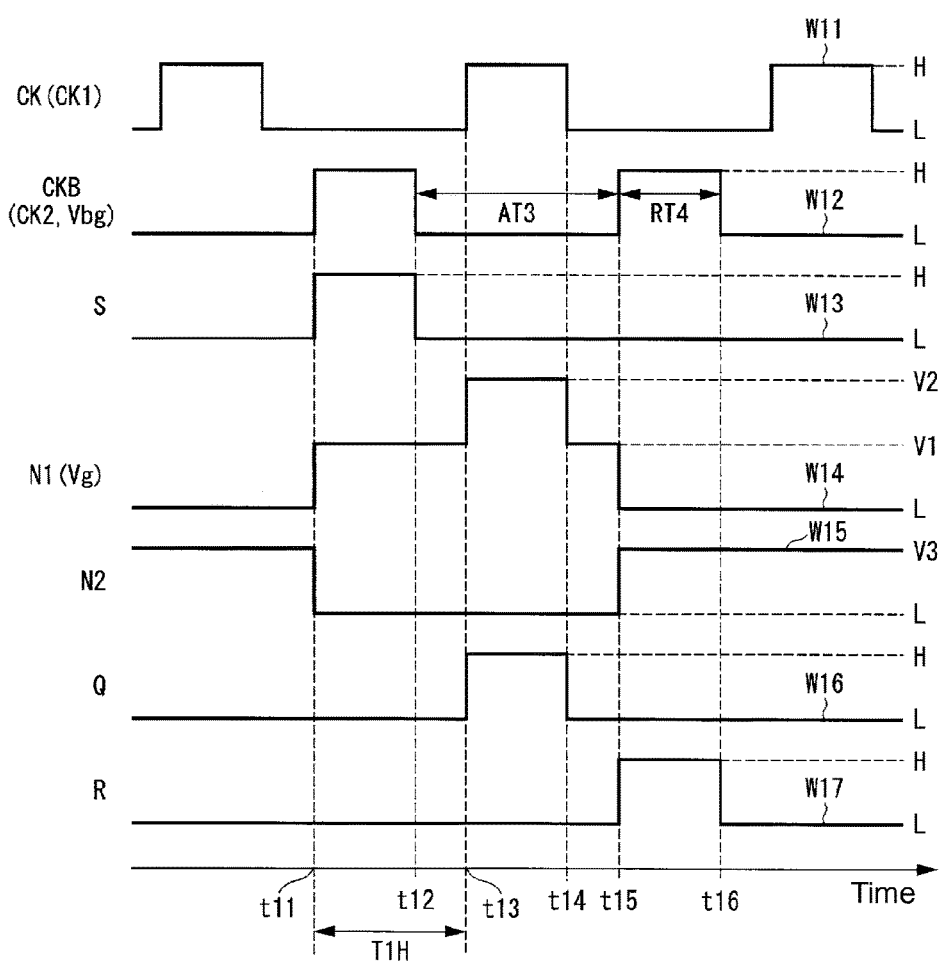
FIG. 15 is a time chart of one example of operation of the SR unit circuit according to Embodiment 3.

FIG. 15 is a time chart of one example of operation of the SR unit circuit 10b according to Embodiment 3.

In FIG. 15, the waveforms W11 to W17 are similar to FIG. 6. Furthermore, in FIG. 15, the horizontal axis is time, and the vertical axis is the signal level (voltage) of the respective waveforms.

The basic operation of the SR unit circuit 10b of the present embodiment from time t11 to time t16 is similar to Embodiment 1 shown in FIG. 6, and thus an explanation thereof will be omitted.

In the present embodiment, the voltage of the node N1 corresponds to the voltage (gate voltage Vg) applied to the gate electrode 42 of the TFT 15bg, and the voltage of the clock signal CKB corresponds to the voltage (back-gate voltage Vbg) applied to the back-gate electrode 48 of the TFT 15bg.

Therefore, in the example shown in FIG. 15, in the period RT4 from time t15 to time t16, the node N1 applies a voltage representing the L state to the gate electrode 42 of the TFT 15bg, and the clock signal CKB applies a voltage representing the H state to the back-gate electrode 48 of the TFT 15bg. In other words, the SR unit circuit 10b, when applying a voltage representing the L state to the gate electrode 42, applies a voltage representing the H state to the back-gate electrode 48.

In this manner, in the present embodiment, in period RT4, the SR unit circuit 10b performs control such that the TFT 15bg is in a non-operational state, and such that the voltage Vbg of the back-gate electrode 48 of the TFT 15bg becomes higher than the gate voltage Vg (Vbg>Vg). This makes it possible for the SR unit circuit 10b to promote recovery from shifts in the threshold voltage of the TFT 15bg.

It should be noted that the period RT4 is a part of the period when a voltage representing the L state is applied to the gate electrode 42. Thus, in the present embodiment, the SR unit circuit 10b, in a part of the period when applying a voltage representing the L state to the gate electrode 42, applies a voltage representing the H state to the back-gate electrode 48.

Furthermore, in the period AT3 from time t12 to time t15, the node N1 applies a voltage representing the H state to the gate electrode 42 of the TFT 15bg, and the clock signal CKB applies a voltage representing the L state to the back-gate electrode 48 of the TFT 15bg. In other words, the SR unit circuit 10b, when applying a voltage representing the H state to the gate electrode 42, applies a voltage representing the L state to the back-gate electrode 48.

In this manner, in the present embodiment, in period AT3, the SR unit circuit 10b performs control such that the TFT 15bg is in an operational state, and such that the voltage Vbg of the back-gate electrode 48 of the TFT 15bg becomes less than the gate voltage Vg (Vbg<Vg). This makes it possible for the SR unit circuit 10b to suppress fluctuations (shifts) in the threshold voltage of the TFT 15bg.

As described above, according to the present embodiment, the back-gate electrode 48 of the TFT 15bg (output transistor) is connected to the clock signal CKB (second clock signal), which has a differing phase from the clock signal CK.

This makes it possible for the shift register circuit 1 of the present embodiment to simply and reliably suppress characteristic degradation and promote recovery of the TFT 40 (TFT 15bg), in a manner similar to Embodiments 1 and 2.

It should be noted that the voltage of the clock signal CKB applied to the back-gate electrode 48 of the TFT 15bg, when H state, is a higher voltage (the power-supply voltage vdd, for example) than voltage V3 of the node N2. Thus, the shift register circuit 1 of the present embodiment makes it possible to apply a higher voltage to the back-gate electrode 48 than in Embodiment 1, in a similar manner to Embodiment 2. Furthermore, the capacitance load of the node N2 can be reduced; therefore, the shift register circuit 1 of the present embodiment can reduce the size of the TFT 13 and the TFT 14 more than in Embodiment 1, in a similar manner to Embodiment 2.

Moreover, in Embodiment 2, recovery is promoted for one pulse period in which the reset signal R is received, but in the present embodiment, the clock signal CKB repeats the H state and the L state at prescribed cycles; thus, the period in which a voltage representing the H state is applied to the back-gate electrode 48 is longer than for the reset signal R. As a result, the shift register circuit 1 of the present embodiment has greater recovery promoting effects of the shifts in threshold voltage than Embodiment 2.

Next, a shift register circuit 1 of Embodiment 4 will be described with reference to the drawings.

Embodiment 4

A shift register circuit 1 of Embodiment 4 differs from Embodiment 1 in that, instead of the SR unit circuit 10, an SR unit circuit 10c that receives a clock signal CK and an initialization signal C is provided. It should be noted that the configuration of the display device 100 of the present embodiment is similar to Embodiment 1 shown in FIG. 1, and thus repetitive explanations thereof will be omitted.

Figure 16:
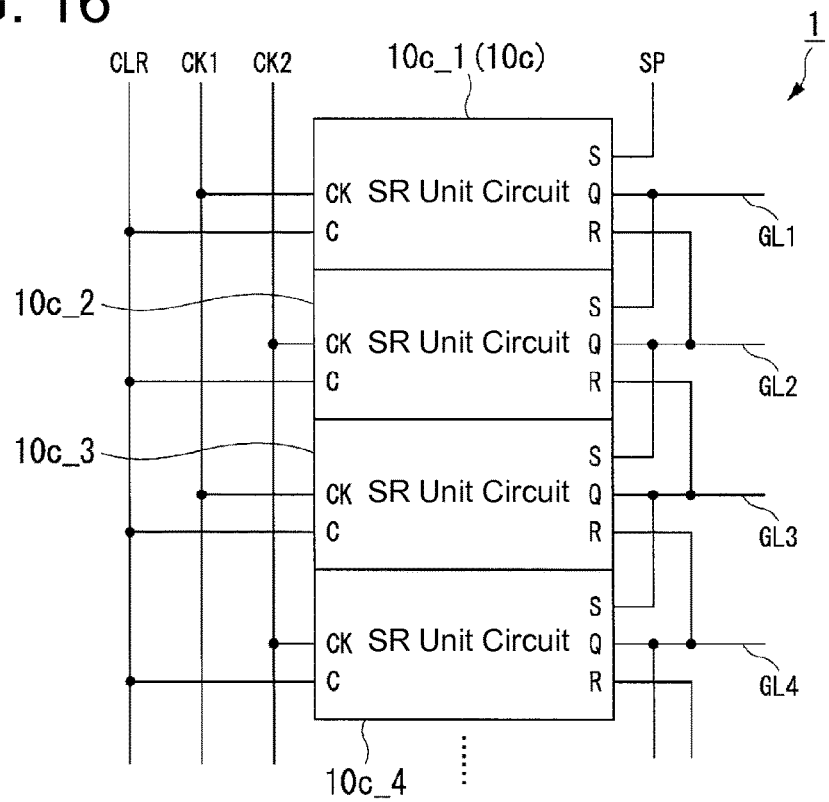
FIG. 16 is a schematic block view of one example of a shift register circuit according to Embodiment 4.

FIG. 16 is a schematic block view of one example of the shift register circuit 1 according to Embodiment 4.

In FIG. 16, the shift register circuit 1 includes a plurality of SR unit circuits 10c (10c_1, 10c_2, 10c_3, 10c_4, etc.). The shift register circuit 1 has a plurality of the SR unit circuits 10c cascade connected together and sequentially outputs, from the respective SR unit circuits 10c, a start pulse signal SP as an output signal in accordance with the clock signals (CK1 and CK2). In this example, the SR unit circuit 10c_1, SR unit circuit 10c_2, SR unit circuit 10c_3, SR unit circuit 10c_4, etc., each have the same configuration; thus, when not distinguishing among any particular SR unit circuit or the like, or when simply indicating the SR unit circuits of the shift register circuit 1, these SR unit circuits may be described as the SR unit circuit 10c.

It should be noted that, in the example shown in FIG. 16, the signal line for the clock signal CK1 is connected to the clock signal CK input terminals of the odd-numbered SR unit circuits 10c (SR unit circuit 10c_1, SR unit circuit 10c_3). Furthermore, the signal line for the clock signal CK2 is connected to the clock signal CK input terminals of the even-numbered SR unit circuits 10c (SR unit circuit 10c_2, SR unit circuit 10c_4). In this example, the clock signal CK1 and clock signal CK2 have mutually differing phases.

In addition, the signal line of the initialization signal CLR is connected to the initialization signal C input terminals of the respective SR unit circuits 10c (10c_1, 10c_2, 10c_3, 10c_4, etc.).

It should be noted that the initialization signal CLR (C) is a control signal that initializes the internal state of the SR unit circuit 10c.

In FIG. 16, the other configurations of the shift register circuit 1 are the same as Embodiment 1 shown in FIG. 2; therefore, an explanation thereof will be omitted.

Next, the configuration of the SR unit circuit 10c of the present embodiment will be described with reference to FIG. 17.

Figure 17:
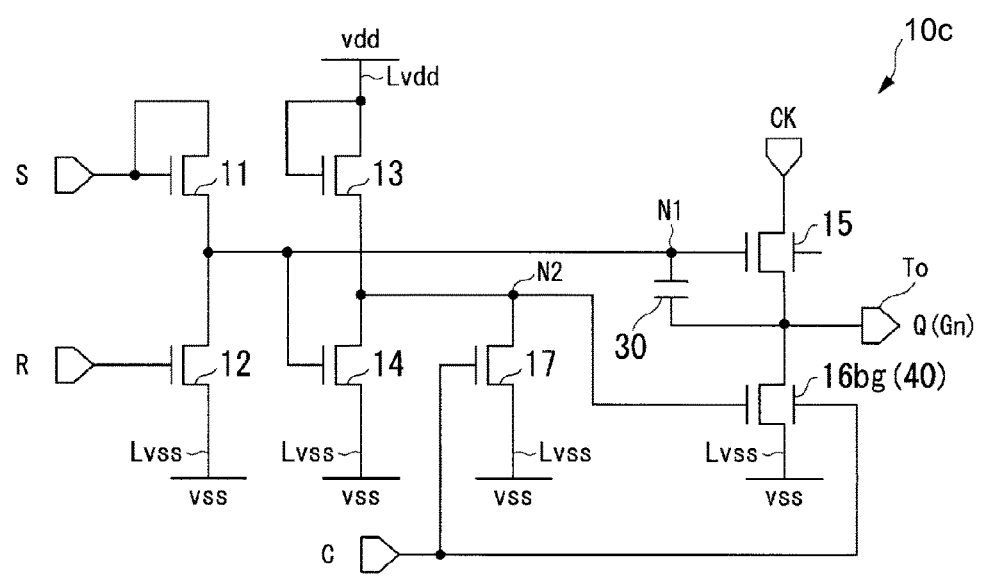
FIG. 17 is a schematic block view of one example of a SR unit circuit according to Embodiment 4.

FIG. 17 is a schematic block view of one example of the SR unit circuit 10c in Embodiment 4.

In FIG. 17, the SR unit circuit 10c includes TFTs (11 to 15, 16bg, 17) and a capacitor 30. In FIG. 17, configurations that are the same as FIG. 3 are given the same reference characters, and an explanation thereof will not be repeated.

It should be noted that the present embodiment differs from the SR unit circuit 10 of Embodiment 1 shown in FIG. 3 in that the TFT 15bg of Embodiment 1 is replaced with a TFT that does not have the back-gate electrode 48, and that the TFT 16 is replaced with the double-gate TFT 16bg (TFT 40). Moreover, the SR unit circuit 10c differs from the SR unit circuit 10 of Embodiment 1 shown in FIG. 3 in including a TFT 17, and in having the connection point of the back-gate electrode 48 of the TFT 16bg be the signal line of the initialization signal C.

The TFT 17 has the drain terminal thereof connected to the node N2, the gate terminal connected to the signal line of the initialization signal C, and the source terminal connected to the power supply line Lvss. The TFT 17, when the initialization signal C is the H state, becomes conductive, and sets the node N2 to the L state (i.e., initializes the node). Furthermore, the TFT 17 becomes non-conductive when the initialization signal C is in the L state, and sets the node N2 to the H state through voltage supplied from the power supply line Lvdd via the TFT 13.

The TFT 15 is an output transistor that connects to the output terminal To, which outputs the output signal of the SR unit circuit 10c, and that outputs the output signal Q (Gn) as the output signal. Specifically, the TFT 15 has the drain terminal thereof connected to the signal line of the clock signal CK, the gate terminal connected to the node N1, and the source terminal connected to the output terminal To.

The TFT 16bg has the drain terminal thereof connected to the output terminal To, the gate terminal connected to the node N2, and the source terminal connected to the power supply line Lvss. In this example, the TFT 16bg is a control transistor that controls conductivity between the output terminal To and the power supply line Lvss through which the power-supply voltage vss is supplied. Furthermore, the TFT 16bg is constituted by the double-gate TFT 40. The TFT 16bg has the gate electrode 42 connected to the node N2 and the back-gate electrode 48 connected to the signal line of the initialization signal C. In other words, in the present embodiment, the back-gate electrode 48 of the TFT 16bg is connected to a signal line that is supplied with the initialization signal, which initializes the internal state of the SR unit circuit 10c.

Furthermore, the TFT 16bg becomes conductive when the node N2 is the H state, and sets the output terminal To to the L state. In addition, the TFT 16bg becomes non-conductive when the node N2 is in the L state. It should be noted that when this TFT 16bg is non-conductive and the gate terminal of the TFT 15 is in the H state, the TFT 15 outputs a pulse signal to the output terminal To of the output signal Q in accordance with the clock signal CK.

In this manner, the SR unit circuit 10c of the present embodiment includes the TFT 16bg, which controls conductivity between the power supply line Lvss that receives the power-supply voltage (power-supply voltage vss, for example) and a prescribed node of the SR unit circuit 10c. The TFT 16bg is the double-gate TFT 40. In this example, the prescribed node includes the output terminal To that outputs the output signal Q.

Next, the operation of the shift register circuit 1 and the SR unit circuit 10c of Embodiment 4 will be described with reference to the drawings.

Figure 18:
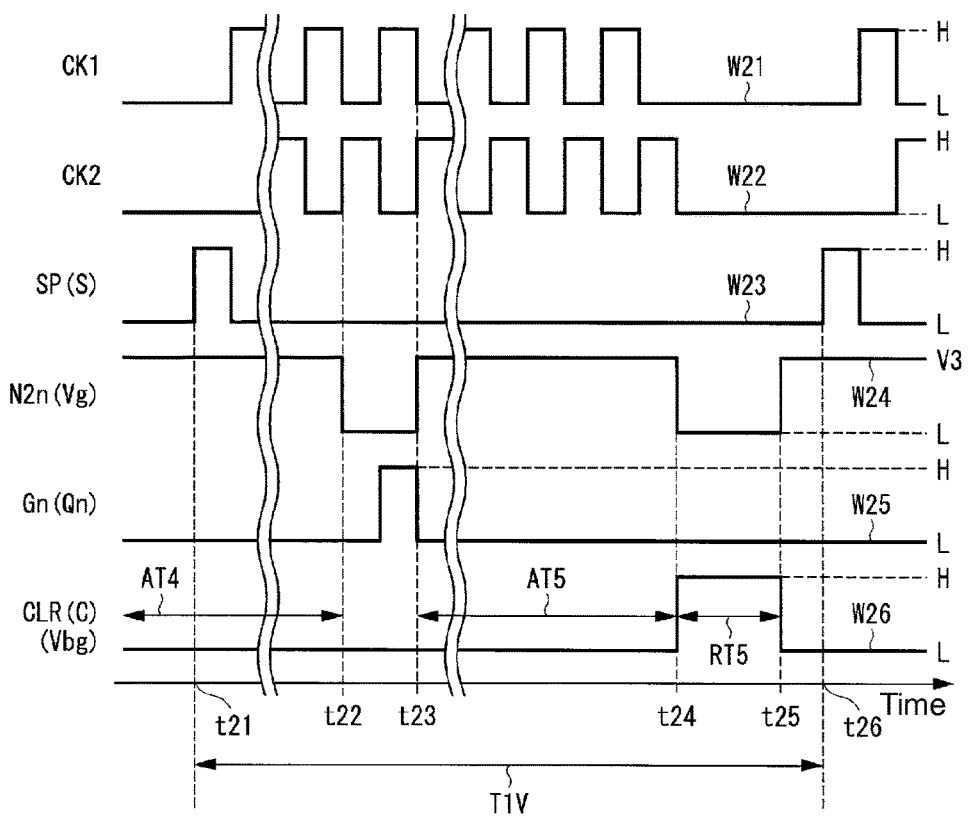
FIG. 18 is a time chart of one example of operation of the shift register circuit according to Embodiment 4.

FIG. 18 is a time chart of one example of operation of the shift register circuit 1 according to Embodiment 4.

In FIG. 18, waveforms W21 to W23 respectively represent a voltage waveform of the clock signal CK1, a voltage waveform of the clock signal CK2, and a voltage waveform of the start pulse signal SP. Furthermore, the waveforms W24 and W25 represent the voltage waveform of the node N2 (N2n) of the $n^{th}$ SR unit circuit 10c, and the voltage waveform of the gate signal Gn (Qn). In addition, the waveform W26 represents the voltage waveform of the initialization signal CLR. Furthermore, in FIG. 18, the horizontal axis is time and the vertical axis is the signal level (voltage) for each of the waveforms.

In this example, the start pulse signal SP corresponds to the input pulse signal S of the SR unit circuit 10c_1, and the gate signal Gn corresponds to the output signal Q of the $n^{th}$ SR unit circuit 10c. In this example, the voltage of the node N2n corresponds to the voltage (gate voltage Vg) applied to the gate electrode 42 of the TFT 16bg, and the voltage of the initialization signal CLR (C) corresponds to the voltage (back-gate voltage Vbg) applied to the back-gate electrode 48 of the TFT 16bg.

It should be noted that, in the drawing, "H" is a voltage at which the logic state is high (H level), and "L" is a voltage at which the logic state is low (L level). Furthermore, voltage V3 is a voltage that has been lowered in an amount equal to the threshold voltage of the TFT 13 from the power-supply voltage vdd supplied to the power supply line Lvdd.

As shown in FIG. 18, first, at time t21, when the start pulse signal SP has transitioned from L level to H level (see waveform W23), the shift register circuit 1 begins shift operation.

The following operations are similar to Embodiment 1 shown in FIG. 5, and at time t22, in accordance with the rise of the clock signal CK2, the node N2n of the $n^{th}$ SR unit circuit 10c becomes L level (see waveform W24).

Moreover, at the rise of the next clock signal CK1, the $n^{th}$ SR unit circuit 10c causes the output signal Qn (gate signal Gn) to transition from L level to H level (see waveform W25).

Next, at the rise of the clock signal CK1 at time t23, the $n^{th}$ SR unit circuit 10c causes the output signal Qn (gate signal Gn) to transition from the H state to the L state. In other words, the $n^{th}$ SR unit circuit 10c outputs a pulse signal to the scan line GLn.

In a similar manner, the shift register circuit 1, at time t24 after the gate signals (G1 to Gn, etc.) for all the scan lines have been output, has the initialization signal CLR transition from the L state to the H state. This causes the TFTs 17 in all of the SR unit circuits 10c to become conductive, and the TFTs 17 cause the respective nodes N2 (nodes N2n) to transition from voltage V3 to L level (see waveform W24). It should be noted that, in this example, the TFT 14 is non-conductive.

Next, at time t25, when the initialization signal CLR transitions from the H state to the L state, the TFT 17 becomes non-conductive, and the TFT 17 causes the node N2 (node N2n) to transition from L level to voltage V3 (see waveform W24). It should be noted that, in this example, the TFT 14 is non-conductive.

Next, at time t26, when the start pulse signal SP has transitioned from L level to H level (see waveform W23), the shift register circuit 1 starts the shift operation again and repeats the above-mentioned operation.

It should be noted that, in FIG. 18, the period from time t21 to time t26 corresponds to one 1V period T1V (one frame period) of the display device 100.

In the present embodiment, the voltage of the node N2 corresponds to the voltage (gate voltage Vg) applied to the gate electrode 42 of the TFT 16bg, and the voltage of the initialization signal CLR (C) corresponds to the voltage (back-gate voltage Vbg) applied to the back-gate electrode 48 of the TFT 16bg.

Thus, in the example shown in FIG. 18, in the period AT4 before time t22 and in period AT5 from time t23 to time t24, the node N2 applies a voltage representing the H state to the gate electrode 42 of the TFT 16bg, and the initialization signal CLR (C) applies a voltage representing the L state to the back-gate electrode 48 of the TFT 16bg. In other words, the SR unit circuit 10c, when applying a voltage representing the H state to the gate electrode 42, applies a voltage representing the L state to the back-gate electrode 48.

In this manner, in the present embodiment, in the period AT4 and the period AT5, the SR unit circuit 10c performs control such that the TFT 16bg is in the operational state and the voltage Vbg of the back-gate electrode 48 of the TFT 16bg becomes lower than the gate voltage Vg (Vbg<Vg). This makes it possible for the SR unit circuit 10c to suppress fluctuations (shifts) in the threshold voltage of the TFT 16bg.

Furthermore, in the example shown in FIG. 18, in period RT5 from time t24 to time t25, the node N2 applies a voltage representing the L state to the gate electrode 42 of the TFT 16bg, and the initialization signal CLR (C) applies a voltage representing the H state to the back-gate electrode 48 of the TFT 16bg. In other words, the SR unit circuit 10c, when applying a voltage representing the L state to the gate electrode 42, applies a voltage representing the H state to the back-gate electrode 48.

In this manner, in the present embodiment, in the period RT5, the SR unit circuit 10c performs control such that the TFT 16bg is in a non-operational state and the voltage Vbg of the back-gate electrode 48 of the TFT 16bg becomes higher than the gate voltage Vg (Vbg>Vg). This makes it possible for the SR unit circuit 10c to promote recovery of the threshold voltage (Vth) of the TFT 16bg that has shifted to plus.

As described above, according to the present embodiment, the SR unit circuit 10c includes the TFT 16bg (control transistor), which controls conductivity between the power supply line Lvss to which the power-supply voltage vss is supplied and a prescribed node of the SR unit circuit 10c, and the TFT 16bg is a double-gate transistor (TFT 40). In this example, the prescribed node includes the output terminal To that outputs the output signal Q.

In the present embodiment, the SR unit circuit 10c includes the TFT 16bg, which functions as a pull-down transistor. This allows for the shift register circuit 1 of the present embodiment to be resistant to noise caused by the clock signal CK, due to the output terminal To being stabilized in the non-operational state.

If the TFT 16bg were not provided, for example, the parasitic capacitance between the gate terminal of the TFT 15 and the drain terminal where the clock signal CK is input may cause noise synchronized with the clock signal CK to be output from the output terminal To even for non-operational SR unit circuits 10c. In such a case, characteristic variation could cause the output waveform of the gate signal Gn to oscillate.

As a countermeasure, the shift register circuit 1 of the present embodiment includes the TFT 16bg, and can thus suppress operational failures as described above. Moreover, the TFT 16bg has little characteristic degradation; therefore, the shift register circuit 1 of the present embodiment makes it possible to avoid phenomena such as susceptibility to oscillation following the passage of time. Thus, the shift register circuit 1 of the present embodiment allows for the display device 100 to have a higher reliability than conventional configurations.

It should be noted that the TFT 16bg has a long operating period in a single frame (1V frame T1V), or rather, a large duty cycle, and is thus susceptible to characteristic degradation. Therefore, marked results can be expected by the shift register circuit 1 of the present embodiment reducing the characteristic degradation of the TFT 16bg.

Furthermore, in the present embodiment, the back-gate electrode 48 of the TFT 16bg is connected to a signal line that is supplied with the initialization signal CLR, which initializes the internal state of the SR unit circuit 10c.

This makes it possible for the shift register circuit 1 of the present embodiment to promote recovery from shifts in threshold voltage of the TFT 16bg in all of the SR unit circuits 10c in order. Accordingly, the shift register circuit 1 of the present embodiment is more capable of efficiently reducing characteristic degradation of the TFT 40 as compared to Embodiments 1 to 3.

Next, a shift register circuit 1 of Embodiment 5 will be described with reference to the drawings.

Embodiment 5

A shift register circuit 1 of Embodiment 5 differs from Embodiment 4 in that an SR unit circuit 10d is provided instead of the SR unit circuit 10c. The shift register circuit 1 of the present embodiment is similar to Embodiment 4 except for the SR unit circuit 10c in FIG. 16 being replaced by the SR unit circuit 10d; thus, repetitive explanations will be omitted. It should be noted that the configuration of a display device 100 of the present embodiment is similar to Embodiment 1 shown in FIG. 1, and thus an explanation thereof will be omitted.

Figure 19:
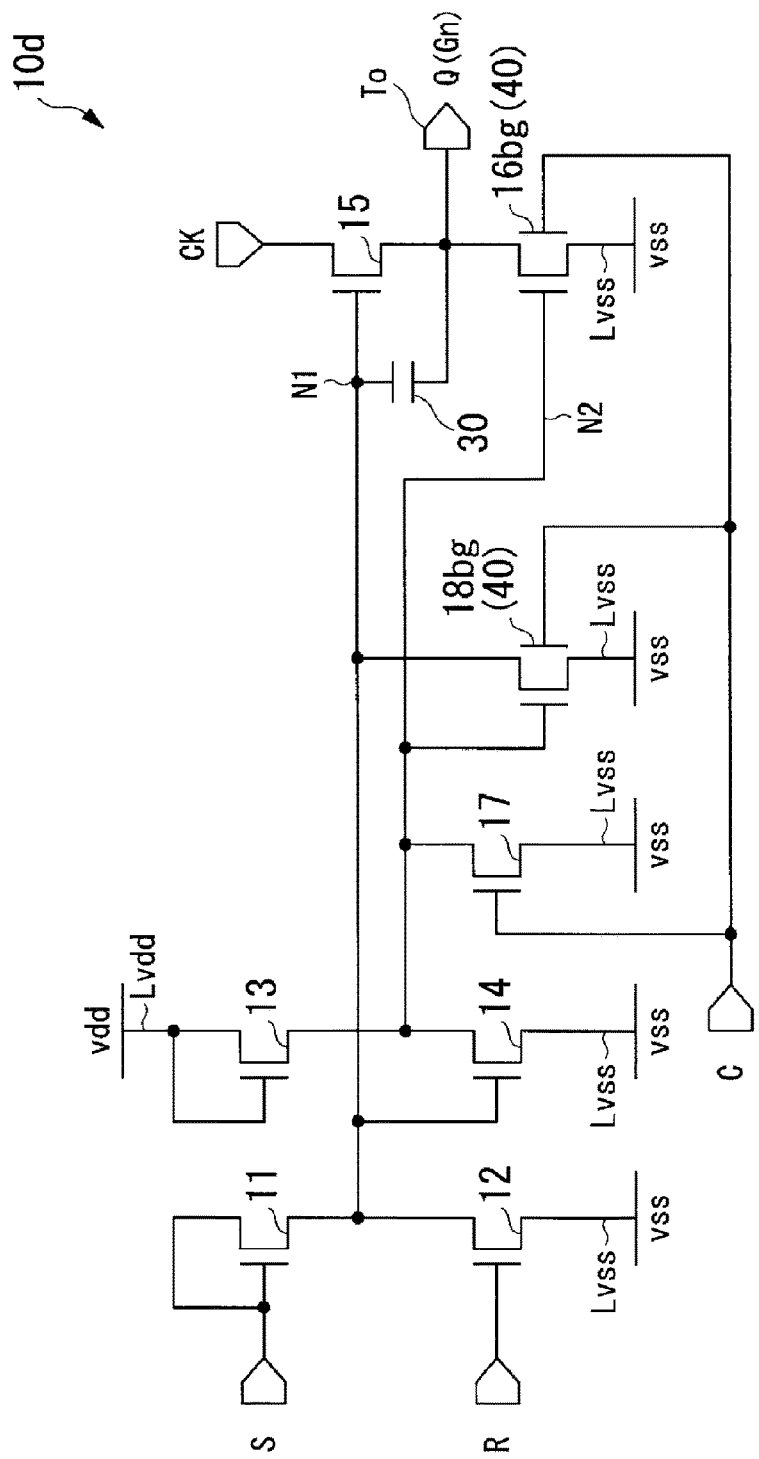
FIG. 19 is a schematic block view of one example of a SR unit circuit according to Embodiment 5.

FIG. 19 is a schematic block view showing one example of the SR unit circuit 10d of Embodiment 5.

In FIG. 19, the SR unit circuit 10d includes TFTs (11 to 15, 16bg, 17, 18bg) and a capacitor 30. In FIG. 19, configurations that are the same as FIG. 17 are given the same reference characters, and an explanation thereof will not be repeated.

It should be noted that the present embodiment also differs from Embodiment 4 in that a double-gate TFT 18*bg* has been added onto the SR unit circuit 10*c* shown in FIG. 17.

The TFT 18*bg* has the drain terminal thereof connected to a node N1, the gate terminal connected to a node N2, and the source terminal connected to a power supply line Lvss. In this example, the TFT 18*bg* is a control transistor that controls conductivity between the power supply line Lvss through which a power-supply voltage vss is supplied and the node N1. Furthermore, the TFT 18*bg* is constituted by the double-gate TFT 40. The TFT 18*bg* has a gate electrode 42 connected to the node N2 and a back-gate electrode 48 connected to the signal line of an initialization signal C. In other words, in the present embodiment, the back-gate electrode 48 of the TFT 18*bg* is connected to a signal line that is supplied with the initialization signal, which initializes the internal state of the SR unit circuit 10*d*.

Furthermore, the TFT 18*bg* becomes conductive when the node N2 is the H state, and sets (pulls down) the node N1 to the L state. In addition, the TFT 18*bg* becomes non-conductive when the node N2 is in the L state.

In this manner, the SR unit circuit 10*d* of the present embodiment includes the TFTs (16*bg* and 18*bg*) that control conductivity between the power supply line Lvss to which the power-supply voltage (power-supply voltage vss, for example) is supplied and a prescribed node of the SR unit circuit 10*d*, and the TFTs (16*bg* and 18*bg*) are double-gate TFTs 40. In this example, an output terminal To that outputs the output signal Q and the node N1 are included as the prescribed node.

Next, the operation of the shift register circuit 1 and the SR unit circuit 10*d* of Embodiment 5 will be described with reference to the drawings.

It should be noted that the shift register circuit 1 of the present embodiment is similar to Embodiment 4 in FIG. 16; thus, repetitive explanations will be omitted.

In the present embodiment, the voltage of the node N2 corresponds to the voltage (gate voltage Vg) applied to the gate electrode 42 of the TFTs (16*bg* and 18*bg*), and the voltage of the initialization signal CLR (C) corresponds to the voltage (back-gate voltage Vbg) applied to the back-gate electrode 48 of the TFTs (16*bg* and 18*bg*).

Therefore, in the present embodiment too, in the period AT4 and the period AT5 in FIG. 18, the SR unit circuit 10*d* performs control such that the TFTs (16*bg* and 18*bg*) are in the operational state and the voltage Vbg of the back-gate electrode 48 of the TFTs (16*bg* and 18*bg*) becomes lower than the gate voltage Vg (Vbg<Vg). This makes it possible for the SR unit circuit 10*d* to suppress fluctuations (shifts) in the threshold voltage of the TFTs (16*bg* and 18*bg*).

Furthermore, in the period RT5 in FIG. 18, the SR unit circuit 10*d* performs control such that the TFTs (16*bg* and 18*bg*) are in the non-operational state and the voltage Vbg of the back-gate electrode 48 of the TFTs (16*bg* and 18*bg*) becomes higher than the gate voltage Vg (Vbg>Vg). This makes it possible for the SR unit circuit 10*d* to promote recovery from shifts in threshold voltage of the TFTs (16*bg* and 18*bg*).

As described above, according to the present embodiment, the SR unit circuit 10*d* includes the TFTs 16*bg* and 18*bg* (control transistors), which control the conductive state between the power supply line Lvss to which the power-supply voltage vss is supplied and a prescribed node of the SR unit circuit 10*d*, and the TFTs (16*bg* and 18*bg*) are double-gate transistors (TFT 40). In this example, the prescribed node includes the output terminal To that outputs the output signal Q and the node N1 that connects to the gate electrode of the TFT 15 (output transistor), which itself connects to the output terminal To.

This makes it possible for the shift register circuit 1 of the present embodiment to reduce characteristic degradation of the TFTs (16*bg* and 18*bg*), which supply the power-supply voltage vss to the output terminal To. Accordingly, the shift register circuit 1 of the present embodiment exhibits similar effects to Embodiment 4.

It should be noted that, in the present embodiment, the SR unit circuit 10*d* includes the TFT 18*bg*, which functions as a pull-down transistor. This allows for the shift register circuit 1 of the present embodiment to be even more resistant to noise caused by the clock signal CK than Embodiment 4, due to the node N1, which is an internal node, being stabilized in the non-operational state.

If the TFT 18*bg* were not provided, for example, the parasitic capacitance between the gate terminal of the TFT 15 and the drain terminal where the clock signal CK is input may cause noise synchronized with the clock signal CK to be output from the output terminal To even for non-operational SR unit circuits 10*d*. In such a case, characteristic variation could cause the output waveform of the gate signal Gn to oscillate.

As a countermeasure, the shift register circuit 1 of the present embodiment includes the TFT 18*bg*, and can thus suppress fluctuations in the node N1 and operational failures as described above.

Next, a shift register circuit 1 of Embodiment 6 will be described with reference to the drawings.

Embodiment 6

A shift register circuit 1 of Embodiment 6 differs from Embodiments 1 to 5 in the configuration of the double-gate transistor.

A double-gate TFT 40*a* of the present embodiment will be described below with reference to FIG. 20.

Figure 20:
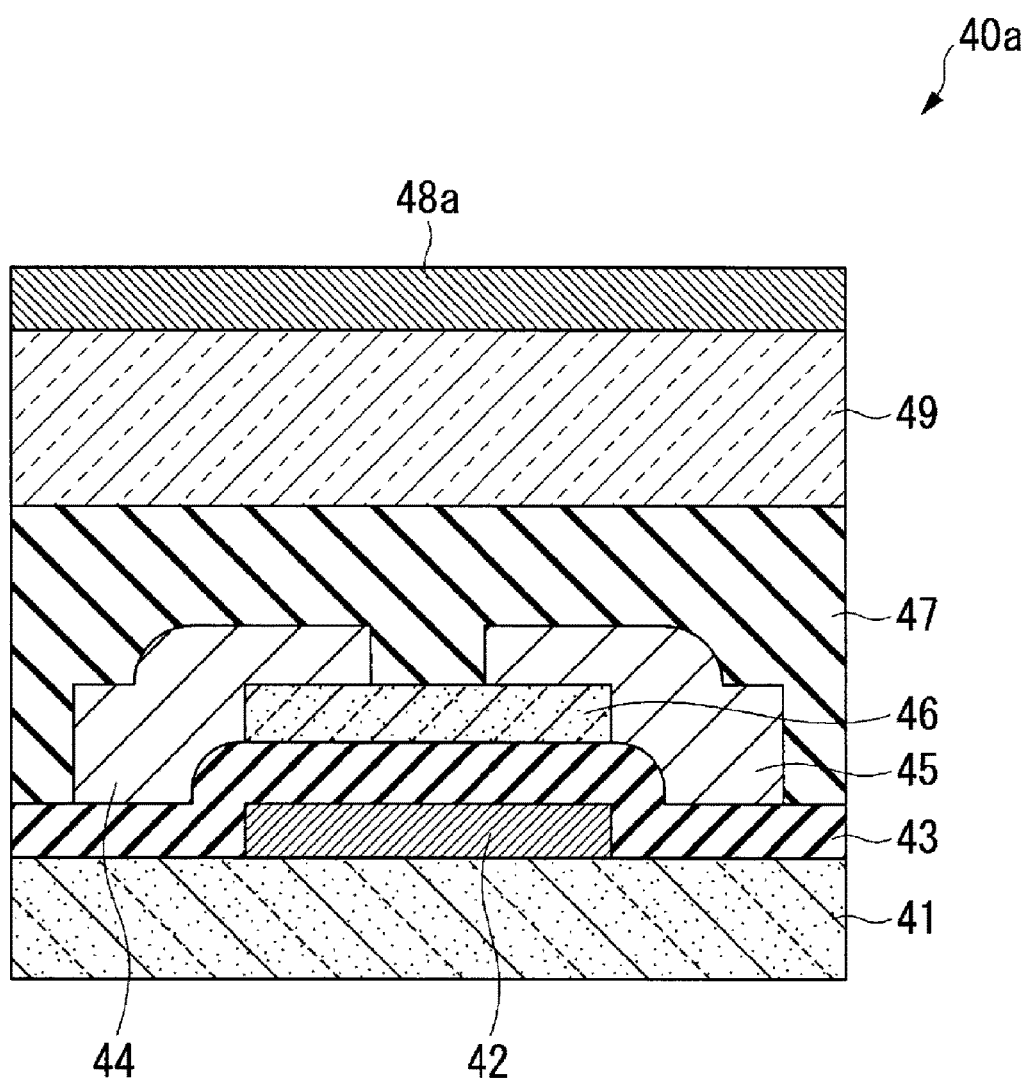
FIG. 20 is a cross-sectional view of one example of a double-gate TFT of Embodiment 6.

FIG. 20 is a cross-sectional view of one example of the double-gate TFT 40*a* of Embodiment 6.

In FIG. 20, the double-gate TFT 40*a* has a substrate 41, gate electrode 42, gate insulating film 43, source electrode 44, drain electrode 45, semiconductor layer 46, insulating film 47, liquid crystal layer 49, and back-gate electrode 48*a*. In FIG. 20, configurations that are the same as FIG. 4 are given the same reference characters, and an explanation thereof will not be repeated.

The TFT 40*a* of the present embodiment includes the liquid crystal layer 49 on the insulating film 47, and the back-gate electrode 48*a* is formed as an opposite electrode that faces the liquid crystal display panel through the insulating film 47 and the liquid crystal layer 49 in which the liquid crystal is sealed.

Next, the shift register circuit 1 of Embodiment 6 will be described with reference to the drawings. It should be noted that the shift register circuit 1 of the present embodiment is similar to Embodiment 4 except for the SR unit circuit 10*c* in FIG. 16 being replaced by the SR unit circuit 10*e*; thus, repetitive explanations will be omitted. It should be noted that the configuration of a display device 100 of the present embodiment is similar to Embodiment 1 shown in FIG. 1, and thus an explanation thereof will be omitted.

Figure 21:
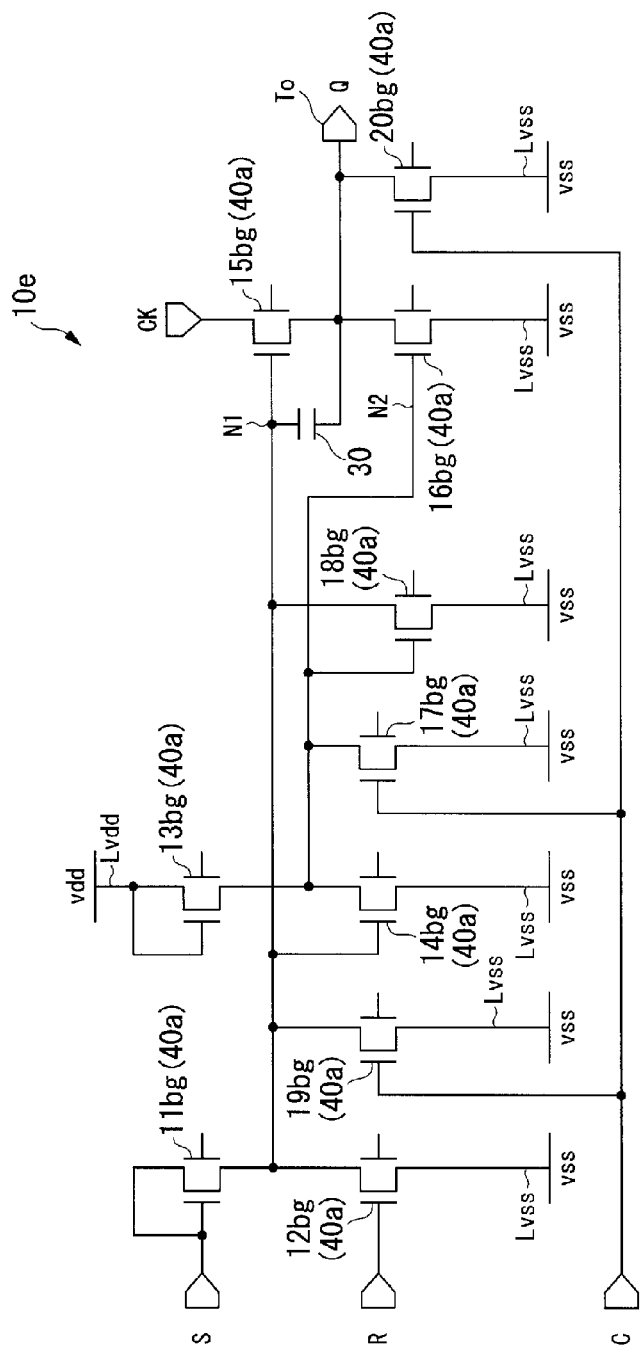
FIG. 21 is a schematic block view of one example of a SR unit circuit according to Embodiment 6.

FIG. 21 is a schematic block view showing one example of the SR unit circuit 10*e* of Embodiment 6.

In FIG. 21, the SR unit circuit 10e includes TFTs (11bg to 20bg) and a capacitor 30. In FIG. 21, the TFTs (11bg to 20bg) are constituted of the double-gate TFT 40a described above, and the back-gate electrodes 48a of the TFTs (11bg to 20bg) are connected to the signal line of the COM of the display device 100 as the opposite electrode.

Furthermore, the present embodiment also differs from Embodiment 5 in that all of the TFTs are double-gate TFTs 40a, as compared to the TFTs (11-15, 16bg, 17, 18bg) in the SR unit circuit 10d in FIG. 19, and in that the TFT 19bg and the TFT 20bg have been added. In this example, the TFTs (11bg to 18bg) have the same connection and functional aspects as the SR unit circuit 10d Embodiment 5 except for the connection of the back-gate electrodes 48a; thus, repetitive explanations will be omitted. The TFT 19bg and the TFT 20bg will be described below.

The TFT 19bg has the drain terminal thereof connected to the node N1, the gate terminal connected to the initialization signal C, and the source terminal connected to the power supply line Lvss. In this example, the TFT 19bg is a control transistor that controls conductivity between the power supply line Lvss through which a power-supply voltage vss is supplied and the node N1. The TFT 19bg, when the initialization signal C (initialization signal CLR) is the H state, becomes conductive, and sets (pulls down) the node N1 to the L state. Furthermore, the TFT 19bg becomes non-conductive when the initialization signal C (initialization signal CLR) becomes the L state.

The TFT 20bg has the drain terminal thereof connected to the output terminal To, the gate terminal connected to the initialization signal C, and the source terminal connected to the power supply line Lvss. In this example, the TFT 20bg is a control transistor that controls conductivity between the output terminal To and the power supply line Lvss through which the power-supply voltage vss is supplied. The TFT 20bg, when the initialization signal C (initialization signal CLR) is the H state, becomes conductive, and sets (pulls down) the output terminal To (scan line GLn) to the L state. Furthermore, the TFT 20bg becomes non-conductive when the initialization signal C (initialization signal CLR) becomes the L state.

In this manner, in the present embodiment, the initialization signal C (initialization signal CLR) becoming the H state causes the TFT 19bg, TFT 17bg, and TFT 20bg to become conductive and correspondingly initializes the node N1, node N2, and output terminal To to the L state.

Next, the operation of the shift register circuit 1 and the SR unit circuit 10e of Embodiment 6 will be described with reference to the drawings.

Figure 22:
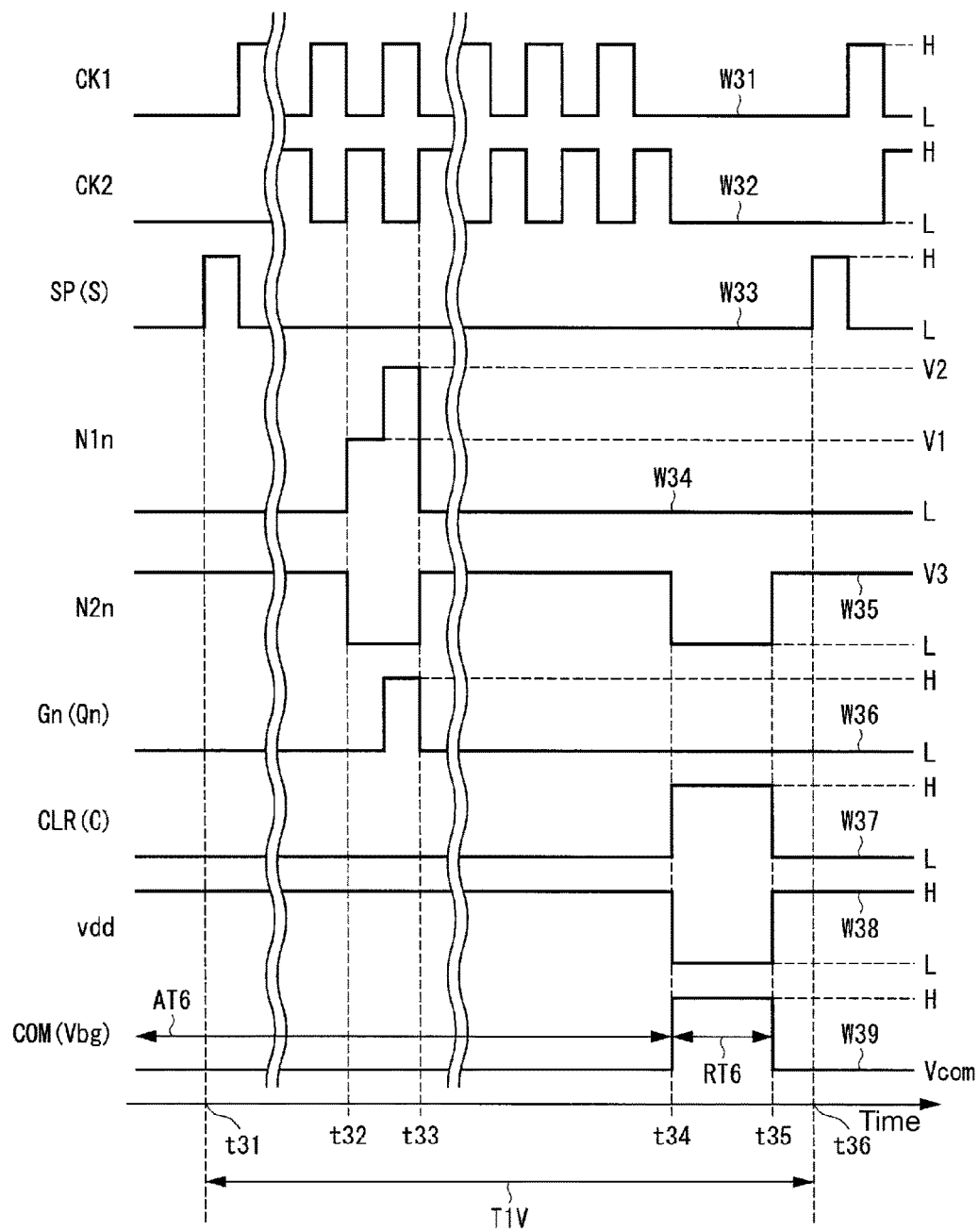
FIG. 22 is a time chart of one example of operation of a shift register circuit according to Embodiment 6.

FIG. 22 is a time chart of one example of operation of the shift register circuit 1 according to Embodiment 6.

In FIG. 22, waveforms W31 to W33 respectively represent a voltage waveform of the clock signal CK1, a voltage waveform of the clock signal CK2, and a voltage waveform of the start pulse signal SP. Furthermore, the waveforms W34 to W36 represent the voltage waveform of the node N1 (N1n) of the n$^{th}$ SR unit circuit 10e, the voltage waveform of the node N2 (N2n), and the voltage waveform of the gate signal Gn (Qn). In addition, the waveforms W37 to W39 represent, in the stated order, the voltage waveform of the initialization signal CLR, the voltage waveform of the power-supply voltage vdd, and the voltage waveform of the common signal COM (voltage waveform of the opposite electrode). Furthermore, in FIG. 22, the horizontal axis is time and the vertical axis is the signal level (voltage) for each of the waveforms.

In this example, the start pulse signal SP corresponds to the input pulse signal S of the SR unit circuit 10e_1, and the gate signal Gn corresponds to the output signal Q of the n$^{th}$ SR unit circuit 10e. Furthermore, in this example, the voltage of the node N2n corresponds to the voltage (gate voltage Vg) applied to the gate electrode 42 of the TFT 16bg, and the voltage of the initialization signal CLR (C) corresponds to the voltage (gate voltage Vg) applied to the gate electrode 42 of the TFTs (17bg, 19bg, 20bg). Moreover, the voltage of the node N1n corresponds to the voltage (gate voltage Vg) applied to the gate electrode 42 of the TFT 14bg and TFT 15bg. The voltage of the common signal COM corresponds to the voltage (back-gate voltage Vbg) applied to the back-gate electrode 48 of the TFTs (11bg to 20bg).

It should be noted that, in the drawing, "H" is a voltage at which the logic state is high (H level), and "L" is a voltage at which the logic state is low (L level). Furthermore, voltage V1 is a voltage that has lowered in an amount equal to the threshold voltage of the TFT 11bg from the H level supplied to the signal line of the input pulse signal S. Voltage V2 is a voltage that is higher than the voltage V1 due to the bootstrap operation of the capacitor 30, and is also higher than "the voltage representing the H state of the clock signal CK+ the threshold voltage of the TFT 15bg." Furthermore, voltage V3 is a voltage that has been lowered in an amount equal to the threshold voltage of the TFT 13bg from the power-supply voltage vdd supplied to the power supply line Lvdd. The voltage Vcom is the optimal common voltage for alternating-current driving of the liquid crystal, and is generally a voltage near the midpoint between H level and L level.

As shown in FIG. 22, first, at time t31, when the start pulse signal SP has transitioned from L level to H level (see waveform W33), the shift register circuit 1 begins shift operation. It should be noted that, in FIG. 22, the operation from time t31 to t33 is similar to the operation from time t21 to t23 in FIG. 18, and an explanation thereof will thus be omitted.

In a similar manner, the shift register circuit 1, at time t34 after the gate signals (G1 to Gn, etc.) for all the scan lines have been output, has the initialization signal CLR transition from the L state to the H state. This causes the TFTs (17bg, 19bg, 20bg) in all of the SR unit circuits 10e to become conductive, and the TFTs (17bg, 19bg, 20bg) cause the prescribed node (node N2 (N2n), for example) respectively connected thereto to transition to L level (see waveform W35).

It should be noted that the display device 100 of the present embodiment, in this example, synchronizes with the initialization signal CLR to set the power-supply voltage vdd to the L state (the power-supply voltage vss, for example) and to set the common signal COM to the H state.

Next, at time t35, when the power-supply voltage vdd returns to the H state and the common signal COM returns to the Vcom state, and the initialization signal CLR transitions from the H state to the L state, the TFT 17bg becomes non-conductive and causes the node N2 (node N2n) to transition from L level to voltage V3 (see waveform W35). It should be noted that, in this example, the TFT 14bg is non-conductive.

Next, at time t36, when the start pulse signal SP has transitioned from L level to H level (see waveform W33), the shift register circuit 1 starts the shift operation again and repeats the above-mentioned operation.

It should be noted that, in FIG. 22, the period from time t31 to time t36 corresponds to a 1V period T1V (one frame period) of the display device 100.

In the present embodiment, the voltage (gate voltage Vg) applied to the gate electrode 42 of the TFTs (11bg to 20bg) is not common throughout; on the other hand, the voltage of the common signal COM is a voltage (back-gate voltage Vbg) that is common to the back-gate electrode 48a of the TFTs (11bg to 20bg).

Thus, in the example shown in FIG. 22, in at least a part of the period AT6 before time t34, a voltage representing the H state is applied to the gate electrode 42 of the TFTs (11bg to 20bg) and the COM voltage is applied to the back-gate electrode 48 of the TFTs (11bg to 20bg) by the common signal COM. In other words, the SR unit circuit 10e, when applying a voltage representing the H state to the gate electrode 42, applies a COM voltage to the back-gate electrode 48.

In a part of the display period, a voltage that is lower than at least a voltage in which the logic state is high is applied to the back-gate electrode 48a.

In this manner, in the present embodiment, in at least a part of the period AT6, the SR unit circuit 10e performs control such that the TFTs (11bg to 20bg) are in an operational state and the voltage Vbg of the back-gate voltage 48a of the TFTs (11bg to 20bg) becomes lower than the gate voltage Vg (Vbg<Vg). This makes it possible for the SR unit circuit 10e to suppress fluctuations (shifts) in the threshold voltage of the TFTs (11bg to 20bg).

Furthermore, in the example in FIG. 22, in the period RT6 from time t34 to time t35, a voltage representing the L state is applied to the gate electrode 42 of the TFTs (11bg to 16bg, 18bg), and a voltage representing the H state is applied to the back-gate voltage 48a of the TFTs (11bg to 16bg, 18bg) by the common signal COM. In other words, the SR unit circuit 10e, when applying a voltage representing the L state to the gate electrode 42, applies a voltage representing the H state to the back-gate electrode 48a. It should be noted that this period RT6 corresponds to the flyback period of the display device 100. In a part of the flyback period, a voltage that is greater than at least a voltage in which the logic state is high is applied to the back-gate electrode 48a.

In this manner, in the present embodiment, in period RT6, the SR unit circuit 10e performs control such that the TFTs (11bg to 16bg, 18bg) are in the non-operational state and the voltage Vbg of the back-gate electrode 48a of the TFTs (11bg to 16bg, 18bg) except for the TFTs (17bg, 19bg, 20bg) becomes greater than the gate voltage Vg (Vbg>Vg). This makes it possible for the SR unit circuit 10e to promote recovery from shifts in threshold voltage of the TFTs (11bg to 16bg, 18bg).

As described above, according to the present embodiment, the back-gate electrode 48a is formed as an opposite electrode that faces the liquid crystal display panel through the insulating film 47 and the liquid crystal layer 49 in which the liquid crystal is sealed.

This makes it possible for the double-gate TFT 40a of the present embodiment to be formed without needing an additional process step. Moreover, the shift register circuit 1 of the present embodiment can control the voltages applied to the back-gate electrode 48a of the TFTs 40a in order via the common signal COM. Accordingly, the shift register circuit 1 of the present embodiment is more capable of efficiently reducing characteristic degradation of the TFTs 40a as compared to Embodiments 1 to 5.

It should be noted that, in the present embodiment, the back-gate electrode 48a is formed as the opposite electrode; thus, patterning the opposite electrode allows the back-gate electrode 48a to be formed on only the desired TFTs. Accordingly, the double-gate TFT 40a may be part of a transistor forming the SR unit circuit 10e. In other words, the back-gate electrode 48a, which is the opposite electrode, may be formed on part of a transistor.

The technical field of the present invention is not limited to those of the embodiments above, and various modifications can be made within a range that does not deviate from the gist of the present invention.

The respective embodiments above have been described as being implemented individually, but may be combined with one another, for example.

Furthermore, in the respective embodiments above, an example was described in which the TFT 40 is a thin-film transistor using an oxide semiconductor such as In—Ga—Zn—O, but the TFT 40 may be amorphous silicon, and if the transistor has fluctuations in threshold voltage due to voltage stress of the gate electrode, then a transistor using a different semiconductor may be used.

In the respective embodiments above, an example was described in which the double-gate TFT 40 was used in the shift register circuit 1 of the scan line drive circuit 102, but the double-gate TFT 40 may be applied to the signal line drive circuit 103.

In the respective embodiments above, an example is described in which the display device 100 is a liquid crystal display device, but a display device of a different scheme may be used, such as an organic EL (electroluminescent) display device, for example.

In the respective embodiments above, an example was described in which the shift register circuit 1 controls the voltage applied to the back-gate electrode 48 by the output signal Q (reset signal R) from the next (subsequent) SR unit circuit 10a, but the voltage applied to the back-gate electrode 48 may be controlled by the output signal Q of a different one of the SR unit circuits 10a. The shift register circuit 1 may control the voltage applied to the back-gate electrode 48 by the control signal Q of the SR unit circuit 10a two stages before or the SR unit circuit 10a two stages after, for example.

Moreover, in Embodiment 6, the timing at which the initialization signal CLR falls may be modified. The timing at which the initialization signal CLR falls, if made to be sooner than the timing at which the common signal COM falls, can promote recovery from shifts in threshold voltage even for TFTs (17bg, 19bg, 20bg) in which the initialization signal C is connected to the gate electrode 42. Furthermore, in period RT6, the voltage of the common signal COM supplied to the opposite electrode can be set to a higher voltage than the voltage of the high state that is normally used, in order to further promote recovery.

INDUSTRIAL APPLICABILITY

The present invention is applicable to a display device such as a liquid crystal television.

DESCRIPTION OF REFERENCE CHARACTERS 1 shift register circuit
10, 10_1, 10_2, 10_3, 10_4, 10a, 10b, 10b_1, 10b_2, 10b_3, 10b_4, 10c, 10c_1, 10c_2, 10c_3, 10c_4, 10d, 10e SR unit circuit
11, 12, 13, 14, 15, 16, 17, 18 TFT
11bg, 12bg, 13bg, 14bg, 15bg, 16bg, 17bg, 18bg, 19bg, 20bg, 40, 40a TFT (with double-gate structure)
30 capacitor
41 substrate
42 gate electrode 43 gate insulating film
44 source electrode
45 drain electrode
46 semiconductor layer
47 insulating film
48, 48a back-gate electrode
49 liquid crystal layer
100 display device
101 display unit
102 scan line drive circuit
103 signal line drive circuit
104 pixel TFT
105 pixel capacitor
PIX pixel unit

What is claimed is:

1. A shift register circuit, comprising:
a plurality of unit circuits that are cascade-connected to one another and that each sequentially output a received pulse signal as an output signal in accordance with a clock signal,
wherein the unit circuits each include a transistor having a double-gate structure comprising a drain electrode, a source electrode, a first gate electrode that controls conductivity between the drain electrode and the source electrode, and a second gate electrode formed through an insulating layer and disposed to face the first gate electrode across a semiconductor layer between the drain electrode and the source electrode,
wherein, in each of the unit circuits, a prescribed voltage is applied to the second gate electrode in accordance with a voltage applied to the first gate electrode,
wherein the respective unit circuits, when applying a voltage representing a high logic state to the first gate electrode, apply a voltage representing a low logic state to the second gate electrode,
wherein the respective unit circuits, when applying a voltage representing a low logic state to the first gate electrode, apply a voltage representing a high logic state to the second gate electrode,
wherein the transistor having the double-gate structure is an output transistor connected to an output terminal outputting the output signal, and
wherein the second gate electrode of the output transistor is connected to an internal node in the same unit circuit such that a voltage representing a logic state that is an inverse of a logic state of a voltage applied to the first gate electrode is applied to the second gate electrode.

2. The shift register circuit according to claim 1, wherein the transistor having the double-gate structure is formed by an oxide semiconductor.

3. The shift register circuit according to claim 1, wherein the second gate electrode is formed as a transparent electrode.

4. A drive circuit, comprising:
the shift register circuit according to claim 1.

5. A display device, comprising:
the drive circuit according to claim 4.

* * * * *